United States Patent
Chen et al.

(10) Patent No.: US 11,676,957 B2
(45) Date of Patent: Jun. 13, 2023

(54) INTEGRATED CIRCUIT DEVICE, SYSTEM AND METHOD

(71) Applicant: TAIWAN SEMICONDUCTOR MANUFACTURING COMPANY, LTD., Hsinchu (TW)

(72) Inventors: Chung-Hui Chen, Hsinchu (TW); Tzu-Ching Chang, Hsinchu (TW); Cheng-Hsiang Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 102 days.

(21) Appl. No.: 17/189,908

(22) Filed: Mar. 2, 2021

(65) Prior Publication Data

US 2021/0375853 A1 Dec. 2, 2021

Related U.S. Application Data

(60) Provisional application No. 63/031,218, filed on May 28, 2020.

(51) Int. Cl.
*H01L 27/02* (2006.01)
*G06F 30/3953* (2020.01)
*H01L 23/528* (2006.01)
*H01L 23/522* (2006.01)

(52) U.S. Cl.
CPC ...... *H01L 27/0207* (2013.01); *G06F 30/3953* (2020.01); *H01L 23/528* (2013.01); *H01L 23/5226* (2013.01)

(58) Field of Classification Search
CPC ............. H01L 27/0207; H01L 23/5226; H01L 23/528; G06F 30/3953
USPC ........................................................ 257/288
See application file for complete search history.

(56) References Cited

U.S. PATENT DOCUMENTS

| | | | |
|---|---|---|---|
| 7,260,442 B2 | 8/2007 | Hwang et al. | |
| 7,761,824 B2* | 7/2010 | Chew | G06F 30/398 716/54 |
| 9,256,709 B2 | 2/2016 | Yu et al. | |
| 10,157,856 B2 | 12/2018 | Wang et al. | |
| 2010/0181547 A1 | 7/2010 | Kuroda | |
| 2014/0040838 A1 | 2/2014 | Liu et al. | |
| 2015/0278429 A1 | 10/2015 | Chang | |
| 2018/0358347 A1 | 12/2018 | Jeong et al. | |

(Continued)

FOREIGN PATENT DOCUMENTS

| | | |
|---|---|---|
| JP | 201017116 | 8/2010 |
| KR | 20180134596 | 12/2018 |

OTHER PUBLICATIONS

Office Action dated Apr. 5, 2022 for corresponding case No. DE 10 2021 105 450.8. (pp. 1-9).

*Primary Examiner* — Tu-Tu V Ho

(74) *Attorney, Agent, or Firm* — Hauptman Ham, LLP

(57) ABSTRACT

An integrated circuit (IC) device includes a substrate having opposite first and second sides, an active region over the first side of the substrate, a first conductive pattern over the active region, and a second conductive pattern under the second side of the substrate. The active region includes a first portion and a second portion. The first conductive pattern is electrically coupled to the first portion and the second portion of the active region. The second conductive pattern is electrically coupled to the first portion and the second portion of the active region.

20 Claims, 17 Drawing Sheets

(56) References Cited

U.S. PATENT DOCUMENTS

2020/0135646 A1    4/2020  Rubin et al.
2020/0144224 A1*  5/2020  Lin ........................ H01L 24/08

* cited by examiner

INTEGRATED CIRCUIT DEVICE, SYSTEM AND METHOD

PRIORITY CLAIM

The present application claims the priority of U.S. Provisional Application No. 63/031,218, filed May 28, 2020, which is incorporated herein by reference in its entirety.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
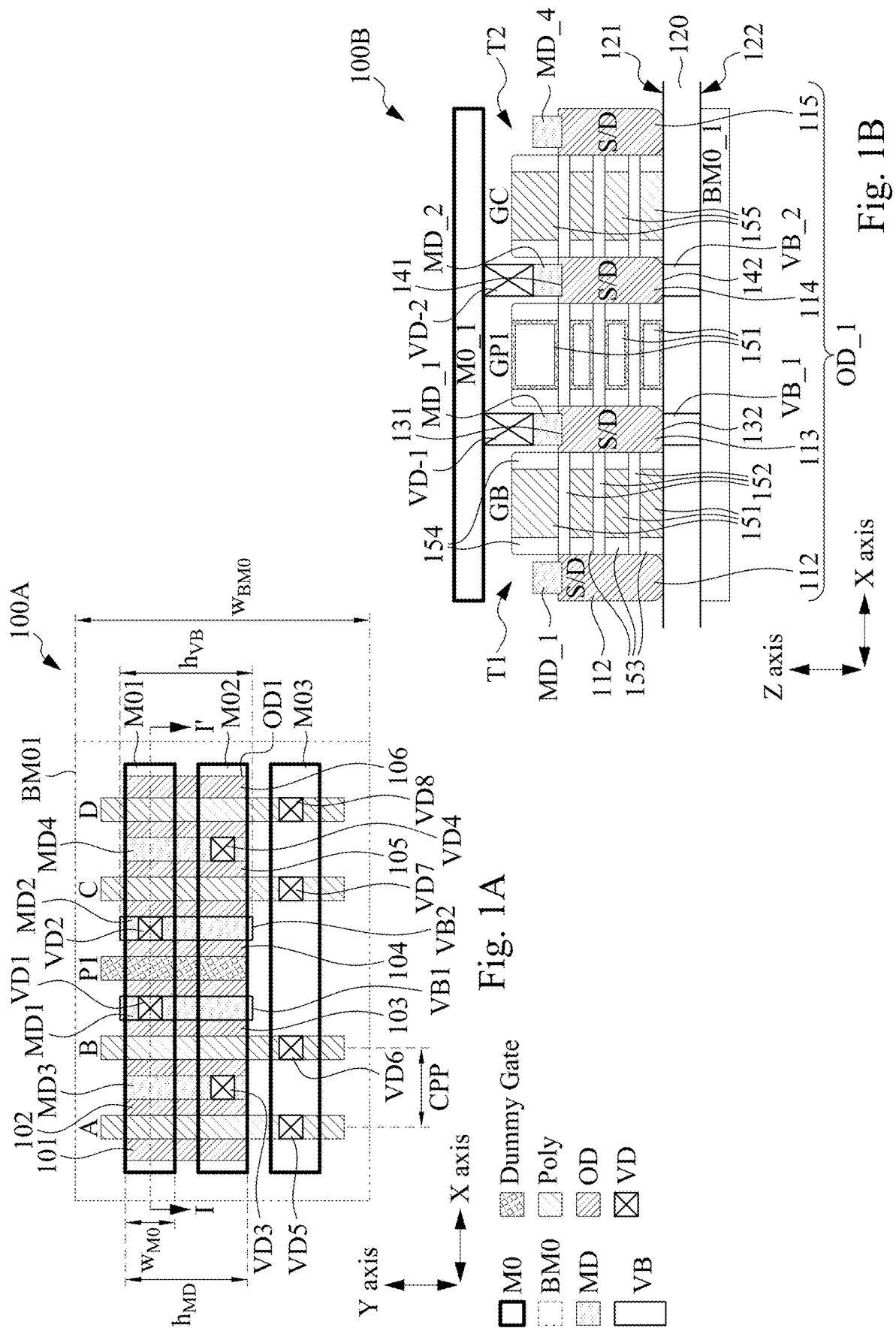
FIG. 1A is a schematic IC layout diagram of an IC device, in accordance with some embodiments.
FIG. 1B is a schematic cross-sectional view of a portion of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Intrinsic and parasitic parameters, such as resistances and capacitances, exist in and/or between various circuit elements and/or connections of an IC device. Such resistances and capacitances potentially affect performance of the IC device under some operating conditions. In some embodiments, various portions of an active region in an IC device are electrically coupled to each other both on a front side and on a back side of the IC device. As a result, resistances of connections between the electrically coupled portions of the active region are reduced, in one or more embodiments. In some embodiments, a gate between the electrically coupled portions of the active region is a dummy gate which contains no conductive material and/or is filled with dielectric material. As a result, parasitic capacitances in a vicinity of the dummy gate are reduced, in one or more embodiments. In at least one embodiment, at lowered connection resistances and parasitic capacitances, it is possible to achieve an improved unit gain frequency in analog applications, such as serializer/deserializer (SERDES) devices. Other applications and/or devices are within the scopes of various embodiments.

FIG. 1A is a schematic IC layout diagram (also referred to as "layout design") 100A of an IC device, in accordance with some embodiments. In at least one embodiment, the IC layout diagram 100A is stored on a non-transitory computer-readable medium.

The IC layout diagram 100A comprises at least one active region, e.g., an active region OD1. Active regions are sometimes referred to as oxide-definition (OD) regions, and are schematically illustrated in the drawings with the label "OD." In some embodiments, active regions of IC layout diagram 100A are usable to manufacture corresponding active regions OD1 of transistor of one or more circuit elements or devices. In the example configuration in FIG. 1A, the active region OD1 extends, or is elongated, along a first axis, or X axis. In an IC device 100B corresponding to the IC layout diagram 100A, the active region OD1 is configured to include P-type dopants or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In some embodiments, the active region OD1 is useable to manufacture sources or drains of transistor devices. In some embodiments, the active region OD1 is useable to manufacture anodes or cathodes of diode devices. An active region configured to form one or more PMOS devices is sometimes referred to as "PMOS active region," and an active region configured to form one or more NMOS devices is sometimes referred to as "NMOS active region." In the example configuration described with respect to FIG. 1A, the active region OD1 comprises an NMOS active region. Other configurations are within the scopes of various embodiments.

The IC layout diagram 100A further comprises a plurality of gate regions A, B, C, D, P1 extending across the active region OD1. The gate regions A, B, C, D, P1 are arranged side by side along the X axis and extend, or are elongated, along a second axis, i.e., Y axis, which is transverse to the X axis. In an IC device 100B corresponding to the IC layout diagram 100A, the gate regions A, B, C, D, also referred to as gate regions of functional transistors, are useable to form corresponding conductive gates which comprise a conductive material. In some embodiments, the gates include polysilicon. Polysilicon is sometimes referred to as "poly," and the gate regions A, B, C, D are schematically illustrated in the drawings with the label "Poly." Other conductive materials for conductive gates, such as metals, are within the scope of various embodiments. The gate region P1 is a dummy gate region, and is illustrated in the drawings with the label "dummy gate." In some embodiments, a dummy gate is a gate region of a dummy transistor. In some embodiments, a dummy transistor is a non-functional transistor. In an IC device 100B corresponding to the IC layout diagram 100A, the dummy gate region P1 corresponds to a dummy gate which contains no conductive material and/or is filled with a dielectric material. In at least one embodiment, the dummy gate region P1 is a continuous-poly-on-oxide-definition edge (CPODE) pattern or a poly-on-oxide-definition-edge (PODE) pattern, and corresponds to a dummy structure, as described in U.S. Pat. No. 10,157,856, which is incorporated by reference herein in its entirety. In the example configuration in FIG. 1A, the gate regions A, B, C, D, P1 are arranged at a constant pitch designated at CPP (contacted poly pitch) along the X axis. The pitch CPP is a center-to-center distance along the X axis between center lines of two immediately adjacent gate regions, for example, the gate regions A, B as indicated in FIG. 1A. Two gate regions are immediately adjacent along the X axis when there is no other gate region between the two gate regions, and/or when the center-to-center distance along the X axis between the two gate regions is CPP.

The gate regions A, B, C, D configure, together with the active region OD1, a plurality of transistors. For example, the gate region A, a source/drain region 101 in the active region OD1, and another source/drain region 102 in the active region OD1 together configure a first transistor (not labelled). The gate region B, a source/drain region 102 in the active region OD1, and another source/drain region 103 in the active region OD1 together configure a second transistor (not labelled), e.g., a transistor corresponding to transistor T1 described with respect to FIGS. 1B-1C. The first transistor having the gate region A and the second transistor having the gate region B share the common source/drain region 102. The gate region C, a source/drain region 104 in the active region OD1, and another source/drain region 105 in the active region OD1 together configure a third transistor (not labelled), e.g., a transistor corresponding to transistor T2 described with respect to FIGS. 1B-1C. The gate region D, the source/drain region 105 in the active region OD1, and another source/drain region 106 in the active region OD1 together configure a fourth transistor (not labelled). The third transistor having the gate region C and the fourth transistor having the gate region D share the common source/drain region 105. In some embodiments, the transistors having the gate regions A, B, C, D are NMOS transistors having n-type active regions. Other configurations are within the scopes of various embodiments. In some embodiments, the transistors having the gate regions A, B, C, D are PMOS transistors having p-type active regions.

The IC layout diagram 100A further comprises contact regions MD1, MD2, MD3, MD4 over corresponding portions of the active region OD1. In an IC device 100B corresponding to the IC layout diagram 100A, contact regions are useable to form corresponding contact structures which include a conductive material formed over corresponding portions of the active region to define an electrical connection from one or more devices formed in the active region to other internal circuitry of the IC device or to outside circuitry. An example conductive material of contact structures includes metal. In some embodiments, a conductive material or a metal throughout this disclosure includes copper, aluminum, titanium, nickel, tungsten, or other suitable conductive material. Other configurations, materials or layers are within the scopes of various embodiments. Contact regions are schematically illustrated in the drawings with the label "MD" (metal over diffusion). In the example configuration in FIG. 1A, the IC layout diagram 100A comprises contact regions MD1, MD2, MD3, MD4. The contact region MD1 is over the source/drain region 103, the contact region MD2 is over the source/drain region 104, the contact region MD3 is over the source/drain region 102, and the contact region MD4 is over the source/drain region 105. The contact regions MD1, MD2, MD3, MD4 extend, or are elongated, along the Y axis, and are arranged alternatively with the gate regions A, B, C, D, P1 along the X axis. In the example configuration in FIG. 1A, a contact pitch (not shown) between immediately adjacent contact regions, i.e., a center-to-center distance along the X axis between center lines of two immediately adjacent contact regions, is the same as the pitch CPP between immediately adjacent gate regions. Two contact regions are immediately adjacent along the X axis when there is no other contact region between the two contact regions, and/or when the center-to-center distance along the X axis between the two contact regions is CPP. Along the X axis, the contact region MD1 is between and immediately adjacent to the gate regions B and P1, the contact region MD2 is between and immediately adjacent to the gate regions C and P1, the contact region MD3 is between and immediately adjacent to the gate regions A and B, and the contact region MD4 is between and immediately adjacent to the gate regions C and D. A contact region and a gate region are immediately adjacent to each other when there is no other contact region or gate region in between, and/or when the center-to-center distance along the X axis between the contact region and the gate region is CPP/2.

The IC layout diagram 100A further comprises a plurality of vias VD1 to VD8 over the contact regions and the gate regions. In an IC device 100B corresponding to the IC layout diagram 100A, the vias are useable to form corresponding conductive via structures over and in electrical contact with the corresponding gates and contact structures. An example material of the via structures includes metal. Other configurations, materials or layers are within the scopes of various embodiments. The vias comprise via over diffusion (VD) vias and via over gate (VG) vias. For simplicity, both VD and VG vias are schematically illustrated in the drawings with the label "VD." In the example configuration in FIG. 1A, the IC layout diagram 100A comprises vias VD1 to VD4 which are over corresponding contact regions MD1, MD2, MD3, MD4. In some embodiments, vias VD1 to VD4 are in the VD layer of layout diagram 100A. In the example configuration in FIG. 1A, the IC layout diagram 100A further comprises vias VD5 to VD8 which are over corresponding gate regions A, B, C, D. In some embodiments, vias VD5 to VD8 are in the VG layer of layout diagram 100A. In some embodiments, vias VD1 to VD8 belong to a same via layer which is the lowermost via layer over, or the closest via layer to, the active region OD1. In some embodiments, one or more of vias VD1 to VD8 are on other layers of layout design 100A or the corresponding IC device.

The IC layout diagram 100A further comprises through vias under the active region OD1 and also under the corresponding contact regions. In an IC device 100B corresponding to the IC layout diagram 100A, the through vias are useable to manufacture corresponding conductive through via structures which extend through a substrate of the IC device as described herein. An example material of through via structures includes metal. Other configurations, materials or layers are within the scopes of various embodiments. Through vias are sometimes referred to as back side vias, and are schematically illustrated in the drawings with the label "VB." In the example configuration in FIG. 1A, the IC layout diagram 100A comprises a through via VB1 under the corresponding contact region MD1, and a through via VB2 under the corresponding contact region MD2. The through vias VB1, VB2 extend, or are elongated, along the Y axis. The described elongated shape of the through vias VB1, VB2 is an example and other configurations are within the scopes of various embodiments. In some embodiments, one or more of vias VB1 to VB2 are on other layers of layout design 100A or the corresponding IC device.

In the example configuration in FIG. 1A, at least one of the contact regions MD1, MD2 has a length or height along the Y axis smaller than a length or height of the corresponding through via VB1, VB2 along the Y axis. For example, as shown in FIG. 1A, the contact region MD1 has a length $h_{MD}$ along the Y axis smaller than a length $h_{VB}$ of the corresponding through via VB1 along the Y axis. When the contact region MD1, MD2 and the corresponding through via VB1, VB2 have the same width along the X axis, an area of the contact region MD1, MD2 is smaller than an area of the corresponding through via VB1, VB2 since the length $h_{MD}$ along the Y axis is smaller than a length $h_{VB}$ of the corresponding through via VB1 along the Y axis. In at least one embodiment, the greater area of the through via VB1, VB2 results in a smaller resistance of the through via VB1, VB2 compared to the corresponding contact region MD1, MD2, which improves performance as described herein. Other arrangements for configuring the area of the through via VB1, VB2 to be greater than the area of the corresponding contact region MD1, MD2, and/or for configuring the resistance of the through via VB1, VB2 to be smaller than the resistance of the corresponding contact region MD1, MD2 are within the scopes of various embodiments.

The IC layout diagram 100A further comprises a first conductive pattern in a first metal layer over the vias VD1 to VD8. In an IC device 100B corresponding to the IC layout diagram 100A, the first conductive pattern is useable to manufacture a corresponding first conductive structure over and in electrical contact with the corresponding vias VD1-VD8 of IC device as described herein. An example material of the first conductive structures includes metal. In the example configuration in FIG. 1A, the first metal layer is a metal-zero (M0) layer which is the lowermost metal layer over the active region OD1. In some embodiments, the M0 layer is located in other metal layers. The M0 layer is schematically illustrated in the drawings with the label "M0," and comprises conductive patterns M01, M02, M03. The conductive pattern M01 is over the vias VD1, VD2. The conductive pattern M02 is over the vias VD3, VD4. The conductive pattern M03 is over the vias VD5, VD6, VD7, VD8. The conductive patterns M01, M02, M03 extend, or are elongated, along the X axis. Other numbers of metal tracks in the conductive patterns are within the scope of the present disclosure.

The IC layout diagram 100A further comprises a second conductive pattern in a second metal layer under the through vias VB1, VB2. In an IC device 100B corresponding to the IC layout diagram 100A, the second conductive pattern is useable to manufacture a corresponding second conductive structure below and in electrical contact with the corresponding vias VB1-VB2 of IC device as described herein. An example material of the second conductive structures includes metal. In the example configuration in FIG. 1A, the second metal layer is a back side-metal-zero (BM0) layer which is the uppermost metal layer under the active region OD1. In some embodiments, the BM0 layer is located in other metal layers. The BM0 layer is schematically illustrated in the drawings with the label "BM0," and comprises a conductive pattern BM01 under the through vias VB1, VB2. The conductive pattern BM01 extends, or is elongated, along the X axis.

In the example configuration in FIG. 1A, at least one of the conductive patterns MO1, M02, M03 has a width along the Y axis smaller than a width of the conductive pattern BM01 along the Y axis. For example, as shown in FIG. 1A, the conductive pattern MO1 has a width wM0 along the Y axis smaller than a width wBMO of the conductive pattern BM01 along the Y axis. As also shown in FIG. 1A, the conductive pattern MO1 further has a smaller length (not numbered in FIG. 1A) along the X axis than the conductive pattern BM01. As a result, an area of the conductive pattern MO1 is smaller than an area of the conductive pattern BM01. In at least one embodiment, the greater area of the conductive pattern BM01 results in a smaller resistance of the conductive pattern BM01 compared to the conductive pattern M01, which improves performance as described herein. Other arrangements for configuring the area of the conductive pattern BM01 to be greater than the area of the conductive pattern M01, and/or for configuring the resistance of the conductive pattern BM01 to be smaller than the resistance of the conductive pattern M01 are within the scopes of various embodiments.

In the IC layout diagram 100A, the first conductive pattern M01, the via VD1, the contact region MD1, the through via VB1, and the second conductive pattern BM01 overlap one another. Further, the first conductive pattern M01, the via VD2, the contact region MD2, the through via VB2, and the second conductive pattern conductive pattern BM01 overlap one another. In an IC device 100B corresponding to the IC layout diagram 100A, the described arrangement corresponds to electrical connections between the source/drain regions 103, 104 over both a front side and a back side of the IC device as described with respect to FIG. 1B.

FIG. 1B is a schematic cross-sectional view of a portion of an IC device 100B. In at least one embodiment, the cross-sectional view in FIG. 1B is taken along line I-I' in FIG. 1A, and the portion of the IC device 100B in FIG. 1B corresponds to a portion of the IC layout diagram 100A between the source/drain region 102 and the source/drain region 105. Corresponding elements of the IC layout diagram 100A and IC device 100B are indicated by similar reference numerals. Specifically, gate regions A, B, C, D, P1 in FIG. 1A correspond to gates GA, GB, GC, GD, GP1 in FIG. 1B, and source/drain regions 102, 103, 104, 105 in FIG. 1A correspond to source/drains 112, 113, 114, 115 in FIG. 1B. Other components in FIG. 1B having corresponding components in FIG. 1A are designated by the same reference numerals of FIG. 1A with an added underscore ("_") symbol. For example, contact region MD1 in FIG. 1A corresponds to contact structure MD_1 in FIG. 1B.

In some embodiments, layout diagram 100A is usable to manufacture IC device 100B. The IC device 100B comprises a substrate 120 having a first side 121 and a second side 122 opposite one another along a Z axis, which coincides with a thickness direction of the substrate 120. In at least one embodiment, the first side 121 is referred to as "upper side" or "front side" or "device side," whereas the second side 122 is referred to as "lower side" or "back side." In some embodiments, the substrate 120 is a semiconductor substrate or a dielectric substrate. Example materials of a semiconductor substrate include, but are not limited to, silicon, silicon germanium (SiGe), Gallium arsenic, or other suitable semiconductor materials. Example materials of a dielectric substrate include, but are not limited to, SiO or other suitable dielectric materials. In some embodiments, N-type and P-type dopants are added to doped regions of the substrate 120 and/or isolation structures are formed between adjacent doped regions. For simplicity, several features such as doped regions and/or isolation structures are omitted from FIG. 1B.

The IC device 100B comprises an active region over the first side of the substrate, and the active region comprises a first portion and a second portion both of which are electrically coupled to a first conductive pattern over the active region and to a second conductive pattern under the second side of the substrate. For example, as illustrated in FIG. 1B, the IC device 100B comprises an active region OD_1 corresponding to the active region OD1 in FIG. 1A, and the active region OD_1 comprises portions 112-115 on the first side 121 of the substrate 120. Among portions 112-115 of the active region OD_1, the first portion 113 and the second portion 114 are electrically coupled to a first conductive pattern M0_1 positioned over the active region, and to a second conductive pattern BM0_1 positioned under the second side 122 of the substrate 120. The first portion 113 is a source/drain of a transistor having the gate GB, e.g., a transistor corresponding to transistor T1 described with respect to FIG. 1C. The second portion 114 is a source/drain of another transistor having the gate GC, e.g., a transistor corresponding to transistor T2 described with respect to FIG. 1C. Source/drain regions are schematically illustrated in the drawings with the label "S/D." Other configurations where at least one of the first portion 113 or the second portion 114 of the active region is not configured as a source/drain of a transistor are within the scopes of various embodiments.

Along the Z axis, the source/drain 113 has opposite upper surface 131 and lower surface 132, and the source/drain 114 has opposite upper surface 141 and lower surface 142. The source/drain 113 is electrically coupled, at the upper surface 131, to a contact structure MD_1 which, in turn, is electrically coupled through a via structure VD_1 to the conductive pattern M0_1. The source/drain 114 is electrically coupled, at the upper surface 141, to a contact structure MD_2 which, in turn, is electrically coupled through a via structure VD_2 to the conductive pattern M0_1. As a result, the source/drain 113 and the source/drain 114 are electrically coupled to each other by the conductive pattern M0_1 on the front side (e.g., the first side 121 of substrate 120). In at least one embodiment, at least one of the upper surface 131 of the source/drain 113 or the upper surface 141 of the source/drain 114 is in direct contact with the corresponding contact structure MD 1, MD 2.

The source/drain 113 is further electrically coupled, at the lower surface 132, to the conductive pattern BM0_1 by way of a through via structure VB_1. The source/drain 114 is also electrically coupled, at the lower surface 142, to the conductive pattern BM0_1 by way of a through via structure VB_2. Each of the through via structures VB_1, VB_2 extends in the thickness direction of the substrate 120, i.e., along the Z axis, from the second side 122 where the through via structures VB_1, VB_2 are in electrical contact with the conductive pattern BM0_1, through the substrate 120, to the first side 121 in electrical contact with the corresponding lower surface 132, 142. As a result, the source/drain 113 and the source/drain 114 are electrically coupled to each other by the conductive pattern BM0_1 on the back side (e.g., the second side 122 of substrate 120). In at least one embodiment, at least one of the lower surface 132 of the source/drain 113 or the lower surface 142 of the source/drain 114 is in direct contact with the corresponding through via structures VB_1, VB_2. In at least one embodiment, the described electrical connections between the source/drain 113 and the source/drain 114 on both the front side and the back side result in a lowered connection resistance with improved performance, as described with respect to FIG. 1C.

In the example configuration in FIG. 1B, the IC device 100B comprises transistors or devices in accordance with nanosheet FET technology. Other transistor or device technologies, such as planar transistor technology, FINFET technology, nanowire FET technology, or the like, are within the scopes of various embodiments. In accordance with the nanosheet FET technology, the gate GB comprises a conductive gate stack 151 extending upward along the Z axis from the first side 121 of the substrate 120. A plurality of channels 152 extend along the X axis across the conductive gate stack 151, and connect the corresponding source/drains 112, 113. The channels 152 are arranged one on top another along the Z axis. A gate dielectric or gate oxide (not shown) is formed between the channels 152 and the conductive gate stack 151. A plurality of inner spacers 153 is arranged alternatingly with the channels 152 along the Z axis. Top spacers 154 are arranged over the topmost channel 152, and around a topmost part of the conductive gate stack 151. In some embodiments, the source/drains 112, 113 are epitaxial grown over the first side 121 of the substrate 120 on opposite sides of a gate structure comprising the conductive gate stack 151 and channels 152. The conductive gate stack 151, and the corresponding source/drains 112, 113 together configure a transistor T1. A via structure (not shown, and corresponding to VD6 in FIG. 1A) electrically couples the topmost part of the conductive gate stack 151 to a conductive pattern (not shown, and corresponding to M03 in FIG. 1A) in the M0 layer. A further via structure (not shown, and corresponding to VD3 in FIG. 1A) electrically couples the source/drain 112 to conductive pattern (not shown, and corresponding M02 in FIG. 1A) in the M0 layer. A further via structure (not shown, and corresponding to VD5 in FIG. 1A) electrically couples the topmost part of a conductive gate stack (not shown, and corresponding to gate A in FIG. 1A) to conductive pattern (not shown, and corresponding M03 in FIG. 1A) in the M0 layer. Example materials of the conductive gate stack 151 include, but are not limited to, polysilicon, metal, Al, AlTi, Ti, TiN, TaN, Ta, TaC, TaSiN, W, WN, MoN, and/or other suitable conductive materials. Example materials of the channels 152 include, but are not limited to, silicon, silicon germanium, gallium arsenic, or other suitable semiconductor materials. Example materials of the spacers 153, 154 include, but are not limited to, silicon nitride, oxynitride, silicon carbide and other suitable materials. Example materials of the gate dielectric include, but are not limited to, silicon oxide, silicon nitride, or a high-k dielectric material. Example high-k dielectric materials include, but are not limited to, HfO2, HfSiO, HfSiON, HfTiO, HfTaO, HfZrO, titanium oxide, aluminum oxide, and zirconium oxide.

The gate GC comprises a conductive gate stack 155 with a configuration similar to the conductive gate stack 151. Channels and spacers associated with the gate GC have similar configurations to the channels 152 and spacers 153, 154 described with respect to the gate GB, and similar description is omitted. The conductive gate stack 155 and the corresponding source/drains 114, 115 together configure a transistor T2.

Channels and spacers associated with the dummy gate GP1 have similar configurations to the channels 152 and spacers 153, 154 described with respect to the gate GB. However, the conductive material is removed from a gate stack 156 of the dummy gate GP1. In other words, the gate stack 156 contains no conductive material. In one or more embodiments, the gate stack 156 is an empty space. In at least one embodiment, the gate stack 156 is filled with a dielectric material, such as silicon oxide, or other suitable dielectric materials. In at least one embodiment, the absence of conductive material in the dummy gate GP1 reduces parasitic capacitances between the gates GB and GC, with improved performance.

Although not shown in FIG. 1B, the IC device 100B further comprises a dielectric layer between the M0 layer (e.g., the conductive pattern M0_1) and the active region (e.g., the source/drains 112-115). In at least one embodiment, the IC device 100B comprises one or more further via layers, dielectric layers and metal layers (not shown) over the M0 layer to form interconnections among circuit elements of the IC device 100B and/or to form electrical connections to external circuitry. Via layers and metal layers from the M0 layer and above are sometimes referred to as front-side via layers and metal layers. The BM0 layer (e.g., the conductive pattern BM0_1) is under the second side 122 of the substrate 120. In at least one embodiment, the BM0 layer is in direct contact with the second side 122 of the substrate 120, and/or the conductive pattern BM0_1 is in direct contact with the through via structures VB_1, VB_2. In at least one embodiment, the IC device 100B comprises one or more further via layers, dielectric layers and metal layers (not shown) under the BM0 layer to form interconnections among circuit elements of the IC device 100B and/or to form electrical connections to external circuitry. Via layers and metal layers from the BM0 layer and below are sometimes referred to as back side via layers and metal layers. In at least one embodiment, the BM0 layer or one or more other metal layers (not shown) under the BM0 layer comprise one or more power supply voltage rails for supplying one or more power supply voltages to circuit elements of the IC device 100B. For example, the conductive pattern BM0_1, in at least one embodiment, comprises power supply voltage rail for supplying a positive supply voltage VDD, or a ground voltage VSS. In some embodiments, the conductive pattern BM0_1 comprises a signal conductive pattern for data (rather than for providing a supply voltage).

Figure 1C:
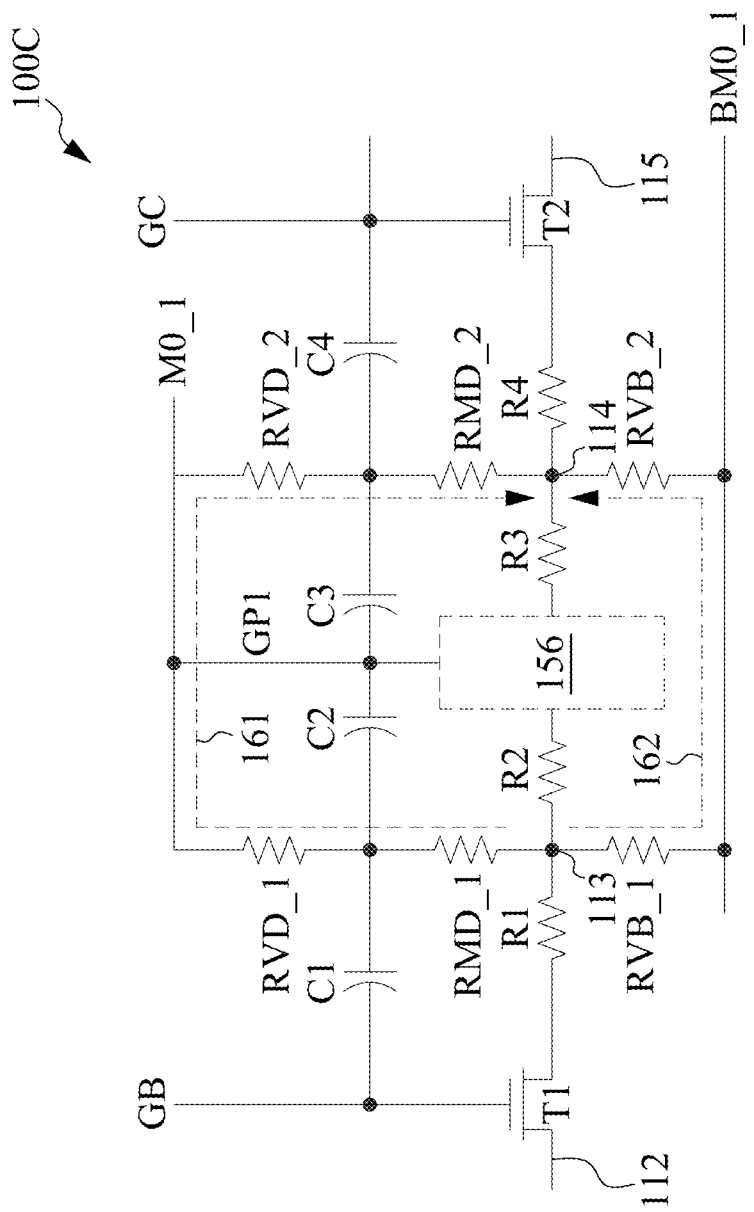
FIG. 1C is a schematic circuit diagram of a circuit in an IC device, in accordance with some embodiments.

FIG. 1C is a schematic circuit diagram of a circuit 100C in an IC device, in accordance with some embodiments. In at least one embodiment, the circuit 100C includes equivalent circuitry of the portion of the IC device 100B in FIG. 1B. Corresponding elements of the circuit 100C and the IC device 100B are indicated by the same reference numerals.

The circuit 100C comprises transistors T1, T2 electrically coupled to each other through the conductive pattern M0_1 on the front side (e.g., the first side 121 of substrate 120), and the conductive pattern BM0_1 on the back side (e.g., the second side 122 of substrate 120). The transistor T1 comprises the gate GB, the source/drain 112, and the source/drain 113. The transistor T2 comprises the gate GC, the source/drain 114, and the source/drain 115. A resistor R1 corresponds to the intrinsic resistance of a portion of the source/drain 113 between the contact structure MD_1 and the gate GB. A resistor R2 corresponds to the intrinsic resistance of another portion of the source/drain 113 between the contact structure MD_1 and the dummy gate P1. Resistors RVD_1, RMD_1, RVB_1 are corresponding intrinsic resistances of via structure VD_1, contact structure MD_1, and through via structure VB_1. A resistor R4 corresponds to the intrinsic resistance of a portion of the source/drain 114 between the contact structure MD_2 and the gate GC. A resistor R3 corresponds to the intrinsic resistance of another portion of the source/drain 114 between the contact structure MD_2 and the dummy gate P1. Resistors RVD_2, RMD_2, RVB_2 are corresponding intrinsic resistances of via structure VD_2, contact structure MD_2, and through via structure VB_2.

Capacitor C1 corresponds to a parasitic capacitance between the gate GB and the contact structure MD_1. Capacitor C2 corresponds to a parasitic capacitance between the dummy gate P1 and the contact structure MD_1. Capacitor C3 corresponds to a parasitic capacitance between the dummy gate P1 and the contact structure MD_2. Capacitor C4 corresponds to a parasitic capacitance between the gate GC and the contact structure MD_2. A region 156 in the circuit 100C corresponds to the gate stack 156 of the dummy gate P1. Because the gate stack 156 contains no conductive material and/or is filled with a dielectric material, the region 156 in the circuit 100C has no associated electrical property, such as resistance or capacitance.

As indicated in FIG. 1C, the source/drain 113 of the transistor T1 and the source/drain 114 of the transistor T2 are electrically coupled to each other on both the front side and the back side. On the front side, the source/drain 113 is electrically coupled to the source/drain 114 through a first, or front side, connection 161 including resistors RMD_1, RVD_1, RVD_2, RMD_2 and conductive pattern M0_1. On the back side, the source/drain 113 is electrically coupled to the source/drain 114 through a second, or back side, connection 162 including resistors RVB_1, RVB_2 and conductive pattern BM0_1. As a result, the source/drain 113 and the source/drain 114 are electrically coupled by two parallel connections, i.e., the front side connection 161 and the back side connection 162. Thus, a resulting connection resistance between the source/drain 113 and the source/drain 114 of the transistors T1, T2 is lowered, compared to situations where the source/drain 113 and the source/drain 114 are electrically coupled through one connection, e.g., through the front side connection 161. In at least one embodiment, the resulting connection resistance between the source/drain 113 and the source/drain 114 is about half of the resistance of the front side connection 161, when the resistance of the front side connection 161 is about the same as the resistance of the back side connection 162. In at least one embodiment, the resulting connection resistance between the source/drain 113 and the source/drain 114 is lower than half of the resistance of the front side connection 161, when the resistance of the back side connection 162 is smaller than the resistance of the front side connection 161. As described with respect to FIG. 1A, there are several configurations for lowering the resistance of the back side connection 162 compared to the front side connection 161. In an example configuration, the through via structures VB_1, VB_2 have a greater length, or height, in the Y axis than the corresponding contact structures MD_1, MD_2. In a further example configuration, the conductive pattern BM0_1 has a greater width in the Y axis than the corresponding conductive pattern M0_1. In yet another example configuration, the material for through via structures VB_1, VB_2 has a higher electrical conductivity than an electrical conductivity of the material for corresponding contact structures MD_1, MD_2. In yet another example configuration, the material for conductive pattern BM0_1 has a higher electrical conductivity than an electrical conductivity of the material for corresponding conductive pattern M0_1. Other configurations for providing the back side connection 162 with a lower resistance than the front side connection 161 are within the scopes of various embodiments.

In the example configurations in FIGS. 1A-1C, the source/drains 113, 114 to be electrically coupled on both the front side and the back side are immediately adjacent source/drains. Other configurations where the source/drains to be electrically coupled on both the front side and the back side are not immediately adjacent source/drains are within the scopes of various embodiments.

In the example configurations in FIGS. 1A-1C, the source/drains 113, 114 to be electrically coupled on both the front side and the back side are immediately adjacent to the dummy gate P1. Other configurations where at least one of the source/drains to be electrically coupled on both the front side and the back side is not immediately adjacent to a dummy gate are within the scopes of various embodiments.

In the example configurations in FIGS. 1A-1C, the source/drains 113, 114 to be electrically coupled on both the front side and the back side are electrically coupled by corresponding conductive patterns in the M0 layer and the BM0 layer. Other configurations where at least one of the front side connection 161 or the back side connection 162 includes a conductive pattern in a front side metal layer other than the M0 layer, or a conductive pattern in a back side metal layer other than the BM0 layer, are within the scopes of various embodiments.

In some embodiments, with a lowered resulting connection resistance between the source/drains which are coupled on both the front side and the back side, the corresponding transconductance (Gm) of the IC device is increased, with an associated performance improvement especially in high frequency applications. In at least one embodiment, such effects are achievable without increasing the pitch between gate regions. This is in contrast to other approaches. In accordance with other approaches, to increase Gm in high frequency applications, the intrinsic resistance and/or capacitance on wiring are to be reduced by adopting wider wiring which, in turn, leads to enlarging the gap or pitch between adjacent components for accommodating the wider wiring. The enlarged pitch reduces device density and/or increase the chip area. Such undesirable consequences are avoidable in at least one embodiment, while still achieving increased Gm and/or improved performance.

In some embodiments, increased Gm and/or improved performance are obtainable without complicated changes to an IC layout diagram. In at least one embodiment, such effects are achievable without an additional mask in the manufacturing process. A reason is that it is possible to form the front side connection 161 and/or the back side connection 162 together with other contact structures, via structures, through via structures, and metal layers of the IC device without an additional mask. For example, in at least one embodiment, the BM0 layer and/or other back side metal layers under the BM0 layer include back side power supply voltage rails, i.e., power supply voltage rails on the back side 122 of the substrate 120. Additional through via structures (not shown) are also formed through the substrate 120 to supply power from the back side power supply voltage rails to the devices or circuit elements on the front side 121 of the substrate 120. In some embodiments, it is possible to form the conductive pattern BM0_1 for electrically coupling the source/drains 113, 114 together with the back side power supply voltage rails, without an additional mask. It is further possible to form the through via structures VB_1, VB_2 together with the additional through via structures for power supply, without an additional mask. Because an additional mask is not required in some embodiments, the manufacturing time, cost or complexity is not significantly increased, while improved performance is still achievable.

Figure 2B:
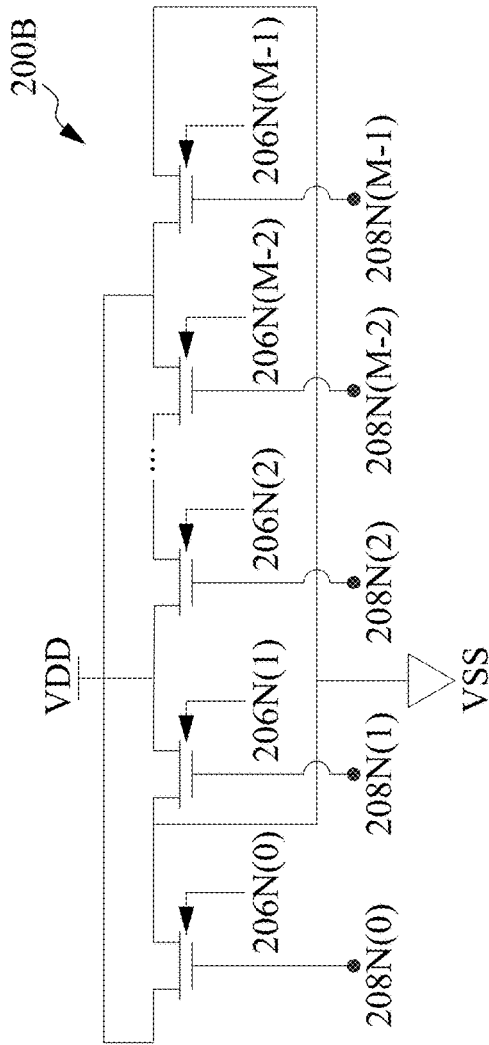
FIGS. 2A-2C are schematic circuit diagrams of circuits in an IC device, in accordance with some embodiments.
Figure 2C:
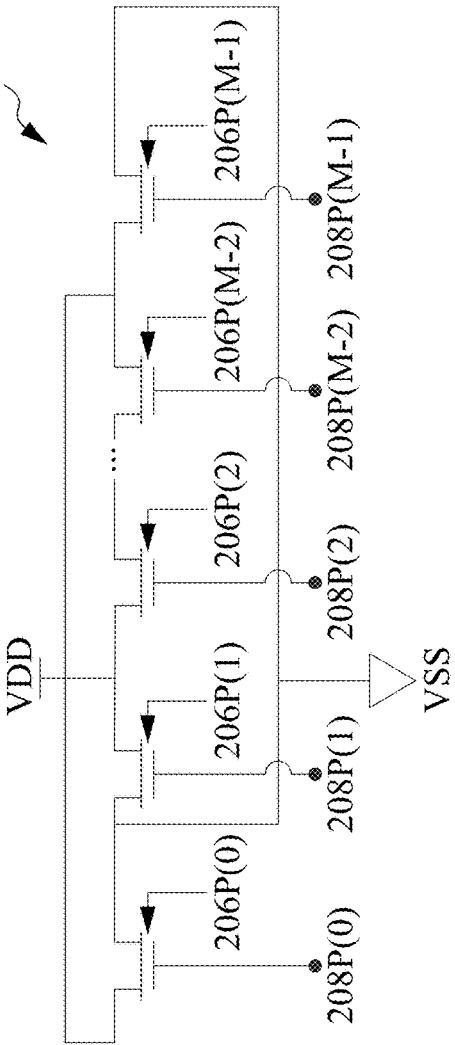
Figure 2A:
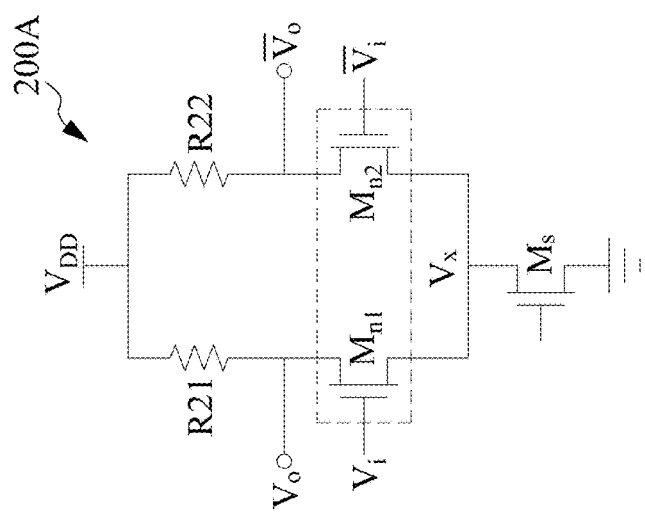

FIG. 2A is a schematic circuit diagram of a circuit 200A in an IC device, in accordance with some embodiments. In some embodiments, circuit 200A incorporates aspects of IC device 100B or circuit 100C.

In the example configuration in FIG. 2A, the circuit 200A is a differential amplifier comprising a differential pair of transistors Mn1, Mn2, load resistors R21, R22, and a current source in the form of a transistor Ms. The resistor R21 is electrically coupled between VDD and at least an output node Vo.

The transistor Mn1 has a source/drain electrically coupled to at least the output node Vo, another source/drain electrically coupled to at least a node Vx, and a gate electrically coupled to an input node Vi.

The resistor R22 is electrically coupled between VDD and at least a differential output node $\overline{V}o$. The transistor Mn2 has a source/drain electrically coupled to at least the differential output node $\overline{V}o$, another source/drain electrically coupled to at least the node Vx, and a gate electrically coupled to a differential input node $\overline{V}i$. The transistor Ms is electrically coupled between the node Vx and ground voltage VSS. The transistor Ms has a gate, a source/drain electrically coupled to at least node Vx and another source/drain electrically coupled to ground voltage VSS. In some embodiments, each of the source/drain of transistor Ms, node Vx, the another source/drain of transistor Mn1, and the another source/drain of transistor Mn2 are electrically coupled together.

The transistors Mn1, Mn2 have corresponding source/drains electrically coupled to each other at the node Vx. In some embodiments, circuit 200A incorporates aspects of IC device 100B or circuit 100C. For example, in some embodiments, transistors Mn1, Mn2 correspond to transistors T1, T2, and the connections between the source/drains of transistors Mn1, Mn2 correspond to the connections 161, 162 between transistors T1, T2 in FIG. 1C. In some embodiments, the source/drains of the transistors Mn1, Mn2 are electrically coupled both on the front side and on the back side of the IC device, for example, as described with respect to FIGS. 1A-1C. In at least one embodiment, one or more advantages of the IC device 100B-100C described herein are achievable with circuit 200A.

FIGS. 2B and 2C are schematic circuit diagrams of circuits 200B and 200C in an IC device, in accordance with some embodiments. In some embodiments, circuits 200A-200B incorporate aspects of IC device 100B or circuit 100C.

In the example configurations in FIGS. 2B-2C, the circuit 200B is a daisy chain arrangement of NMOS transistors, and the circuit 200C is a corresponding daisy chain arrangement of PMOS transistors. In at least one embodiment, the circuit 200B and the circuit 200C are parts of a SERDES device. The circuit 200B comprises NMOS transistors 206N(0), 206N(1), 206N(2), 206N(M-2) and 206N(M-1), and gate electrodes 208N(0), 208N(1), 208N(2), 208N(M-2) and 208N(M-1), where M is a positive integer. The NMOS transistors 206N(0), 206N(1), 206N(2), 206N(M-2) and 206N(M-1) are electrically coupled into a daisy chain as shown in FIG. 2B.

The circuit 200C comprises PMOS transistors 206P(0), 206P(1), 206P(2), 206P(M-2) and 206P(M-1), and gate electrodes 208P(0), 208P(1), 208P(2), 208P(M-2) and 208P(M-1). The PMOS transistors 206P(0), 206P(1), 206P(2), 206P(M-2) and 206P(M-1) are electrically coupled into a daisy chain as shown in FIG. 2C.

In the circuits 200B, 200C, adjacent NMOS or PMOS transistors have source/drains and corresponding source/drains electrically coupled to each other. In some embodiments, at least one of circuits 200B, 200C incorporates aspects of IC device 100B or circuit 100C. For example, in some embodiments, adjacent NMOS or PMOS transistors of FIGS. 2B-2C correspond to transistors T1, T2, and the connections between the source/drains of adjacent NMOS or PMOS transistors of FIGS. 2B-2C correspond to the connections 161, 162 between transistors T1, T2 in FIG. 1C. In some embodiments, the source/drain connections between non-adjacent NMOS transistors (e.g., NMOS transistor 206N(0) and 206N(M-1)) or non-adjacent PMOS transistors (e.g., PMOS transistor 206P(0) and 206P(M-1)) are combined with the connection(s) between the source/drains of adjacent NMOS or PMOS transistors, and correspond to the connections 161, 162 between transistors T1, T2 in FIG. 1C. In other words, in some embodiments, connection 161 or 162 of FIG. 1C can be used to electrically couple adjacent source/drain regions with non-adjacent source/drain regions and/or gates of transistors.

In some embodiments, the corresponding source/drains of at least one pair of adjacent NMOS or PMOS transistors of FIGS. 2B-2C are electrically coupled both on the front side and on the back side of the IC device, for example, as described with respect to FIGS. 1A-1C. In some embodiments, the corresponding source/drains of every pair of adjacent NMOS or PMOS transistors are electrically coupled both on the front side and on the back side of the IC device, for example, as described with respect to FIGS. 1A-1C. In at least one embodiment, one or more advantages of the IC device 100B-100C described herein are achievable in the SERDES device including circuits 200B, 200C. In at least one embodiment, the SERDES device including circuits 200B, 200C with a high Gm, and also achieving high unit gain frequency. Other circuit types or devices are within the scope of the present disclosure.

Figure 3:
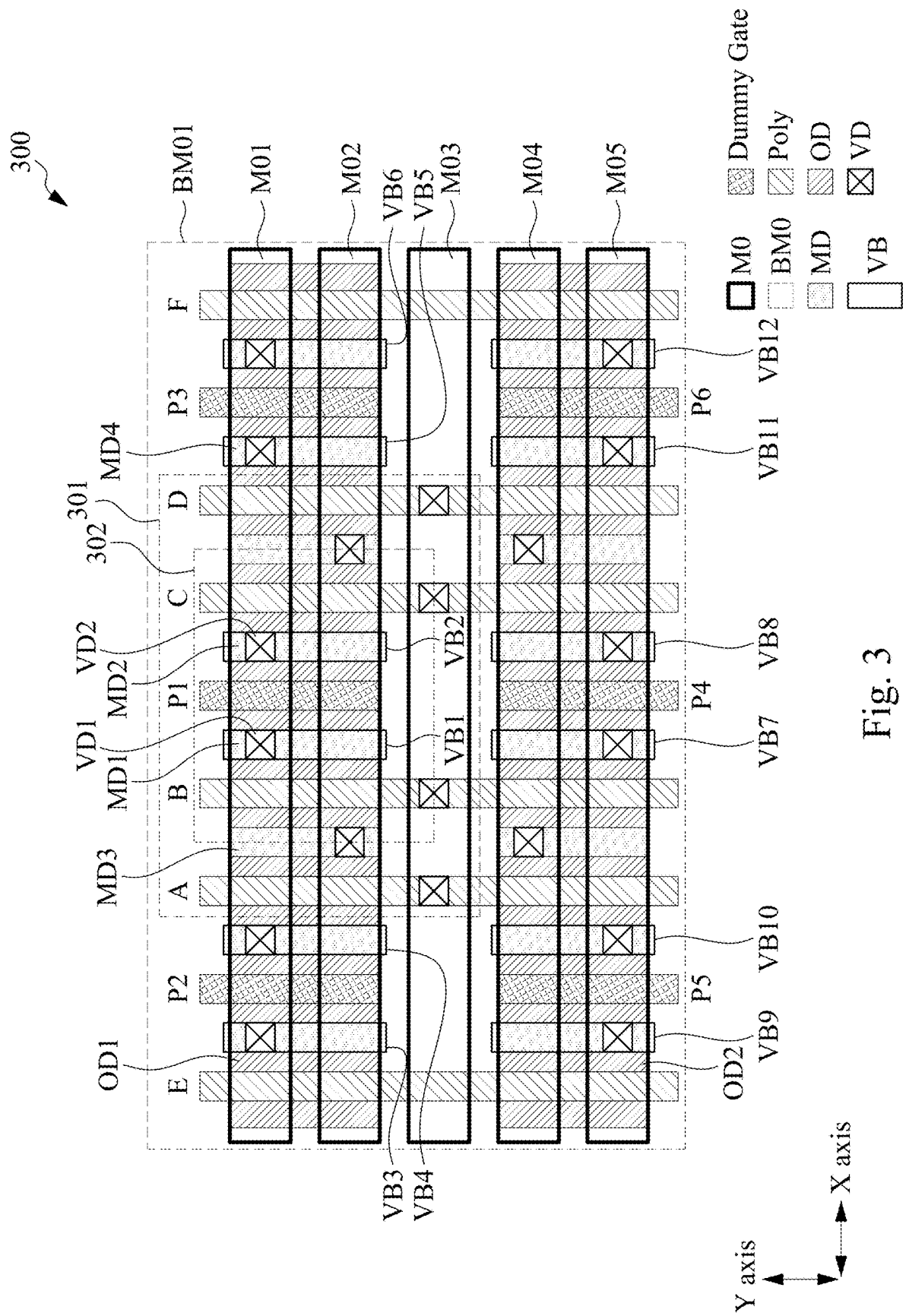
FIG. 3 is a schematic IC layout diagram of an IC device, in accordance with some embodiment.

FIG. 3 is a schematic IC layout diagram 300 of an IC device, in accordance with some embodiment.

The IC layout diagram 300 comprises a region 301 corresponding to the IC layout diagram 100A in FIG. 1A. Compared to the IC layout diagram 100A, the IC layout diagram 300 further comprises another active region OD2, gate regions E, F, and dummy gate regions P2-P6. The gate regions E, F correspond to gates for configuring functional transistors. The dummy gate regions P2-P6 correspond to dummy gates which, in at least one embodiment, include no conductive material and/or are filled with a dielectric material. In at least one embodiment, each of the gate regions E, F corresponds to two separate gate portions correspondingly over the active region OD1 and the active region OD2, for example, as described with respect to FIGS. 4A-4F.

The active region OD2 is spaced from the active region OD1 along the Y axis. In at least one embodiment, the active region OD2 corresponds to a dopant type different from the dopant type of the active region OD1. For example, the active region OD1 is configured as an NMOS active region for forming NMOS transistors, and the active region OD2 is configured as a PMOS active region for forming PMOS transistors, and vice versa. In at least one embodiment, NMOS transistors in the active region OD1 correspond to various NMOS transistors in the daisy chain arrangement of NMOS transistors of the circuit 200B, and PMOS transistors in the active region OD2 correspond to various PMOS transistors in the daisy chain arrangement of PMOS transistors of the circuit 200C. In other words, the IC layout diagram 300, in one or more embodiments, comprises the layout of NMOS and PMOS daisy chain arrangements in a SERDES device.

Over the active region OD1, configurations and/or connections of various elements between the gate regions E and A are similar to those between the gate regions B and C as described herein, and similar detailed description is omitted. For example, a source/drain region immediately adjacent to the gate region E is configured to be electrically coupled to a source/drain region immediately adjacent to the gate region A, on both the front side and the back side. The connection on the front side comprises corresponding MD contact regions (not numbered), VD vias (not numbered), and the conductive pattern M01. The connection on the back side comprises corresponding through vias VB3, VB4, and the conductive pattern BM01. Also over the active region OD1, configurations and/or connections of various elements between the gate regions D and F are similar to those between the gate regions B and C as described herein, and similar detailed description is omitted. For example, a source/drain region immediately adjacent to the gate region D is configured to be electrically coupled to a source/drain region immediately adjacent to the gate region F, on both the front side and the back side. The connection on the front side comprises corresponding MD contact regions (not numbered), VD vias (not numbered), and the conductive pattern M01. The connection on the back side comprises corresponding through vias VB5, VB6, and the conductive pattern BM01.

Over the active region OD2, configurations and/or connections of various elements are similar to those described with respect to the active region OD1, and similar detailed description is omitted. For example, the dummy gate regions P4-P6 correspond to the dummy gate regions P1-P3, through vias VB7-VB12 correspond to through vias VB1-VB6, and conductive patterns M04, M05 correspond to conductive patterns M02, M01. In some embodiments, a region (not labelled) of IC layout diagram 300 associated with active region OD1 is a mirror image of a region (not labelled) of IC layout diagram 300 associated with active region OD2 with respect to the X axis. In at least one embodiment, the BM0 layer comprises the conductive pattern BM01 underlying the active region OD1, and another conductive pattern underlying the active region OD2, for example, as described with respect to FIGS. 4A-4F. Other configurations of IC layout diagram 300 are within the scope of the present disclosure. For example, in some embodiments, at least conductive pattern M01, M02, M04 or M05 is configured to be further coupled to one or more of gates A, B, C, D, E or F.

In some embodiments, the IC layout diagram 300, or a portion of the IC layout diagram 300, is stored as a standard cell in a standard cell library on a non-transitory computer-readable medium. For example, the IC layout diagram 300 includes a portion 302 in which the gate regions B, C, the dummy gate region P1, and various corresponding MD contact regions, VD/VG vias, VB through vias, and conductive patterns in the M0 and BM0 layers are arranged as described with respect to FIG. 1A. The portion 302 is stored as a standard analog cell in one or more embodiments. In at least one embodiment, multiple instances of a standard cell corresponding to the IC layout diagram 300 or a portion of the IC layout diagram 300 are placed side by side in a repeating manner along at least one of the X axis or the Y axis, to obtain a IC layout diagram of an IC device. In at least one embodiment, one or more advantages described herein are achievable in an IC device corresponding to the IC layout diagram 300.

FIGS. 4A-4F are various schematic perspective views of an IC device 400 at various layers, in accordance with some embodiments. In at least one embodiment, the IC device 400 corresponds to the IC layout diagram 300. In some embodiments, layout diagram 300 is usable to manufacture IC device 400. The schematic perspective views in FIGS. 4A-4F are for illustrative purposes, and do not necessarily reflect a sequence for manufacturing the IC device 400. Corresponding elements of the IC layout diagram 300 and IC device 400 are indicated by similar reference numerals. Specifically, gate regions A, B, C, D, E, F, P1, P2, P3, P4, P5, P6 in FIG. 3 correspond to gates GA, GB, GC, GD, GE, GF, GP1, GP2, GP3, GP4, GP5, GP6 in FIGS. 4A-4F. Other components in FIG. 3 having corresponding components in FIGS. 4A-4F are designated by the same reference numerals of FIG. 3 with an added underscore ("_") symbol. For example, active region OD2 in FIG. 3 corresponds to active region OD_2 in FIGS. 4B-4F.

Figure 4A:
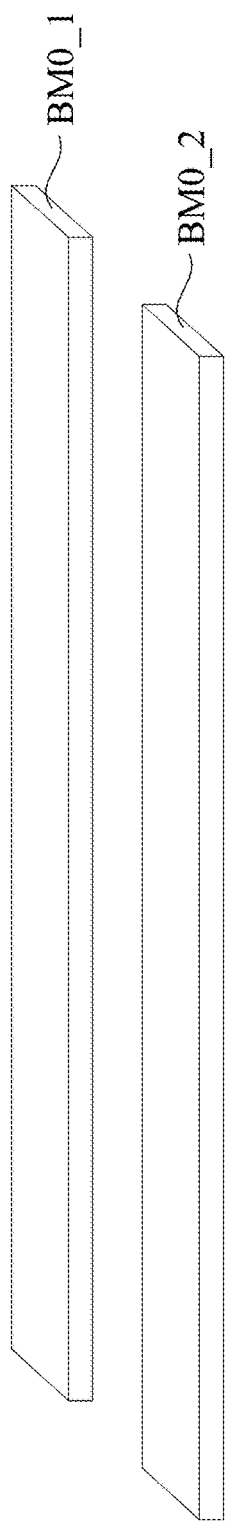
FIGS. 4A-4F are various schematic perspective views of an IC device at various layers, in accordance with some embodiments.

A schematic perspective view 400A in FIG. 4A illustrates the BM0 layer of the IC device 400. The BM0 layer comprises conductive patterns BM0_1, and BM0_2 extending along the X axis and spaced from each other along the Y axis.

Figure 4B:
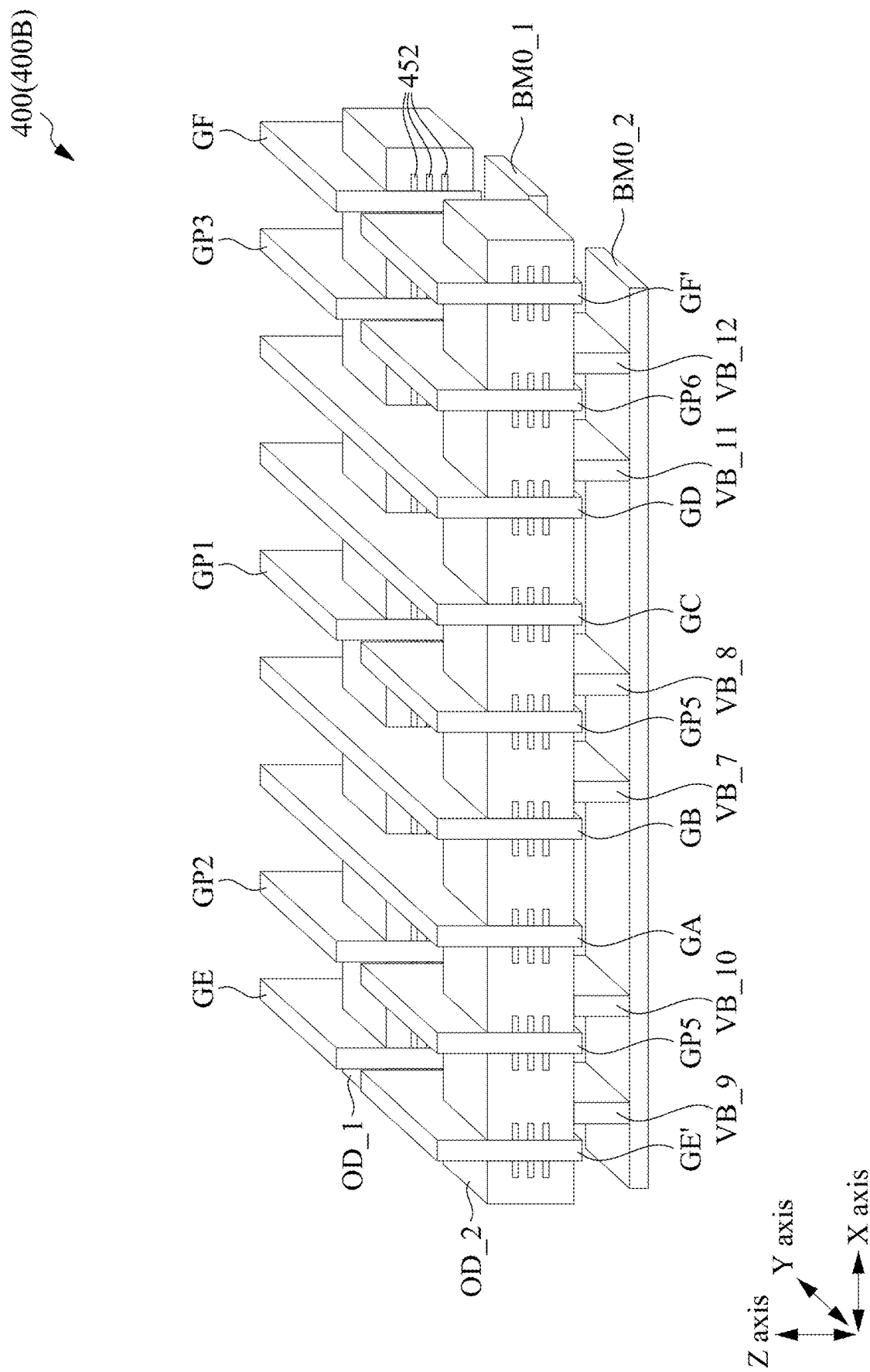

A schematic perspective view 400B in FIG. 4B further illustrates various layers above the BM0 layer. Through via structures VB_7-VB_12 are over the corresponding conductive pattern BM0_2. Other through via structures VB_1-VB_6 over the corresponding conductive pattern BM0_1 are not visible in the view 400B. For simplicity, a substrate through which the through via structures extend is not illustrated. Active regions OD_1, OD_2 are over the corresponding conductive pattern BM0_1, BM0_2. Gates GA-GF, GE' and GF', and dummy gates GP1-GP6 extend across the corresponding active regions OD_1, OD_2. The gates GE', GF' are separated parts of the corresponding gates GE, GF, and are over the active region OD_2. Various channels (for example, indicated at 452) are formed around the corresponding gate regions, and correspond to the channels 152 described with respect to FIG. 1B.

Figure 4C:
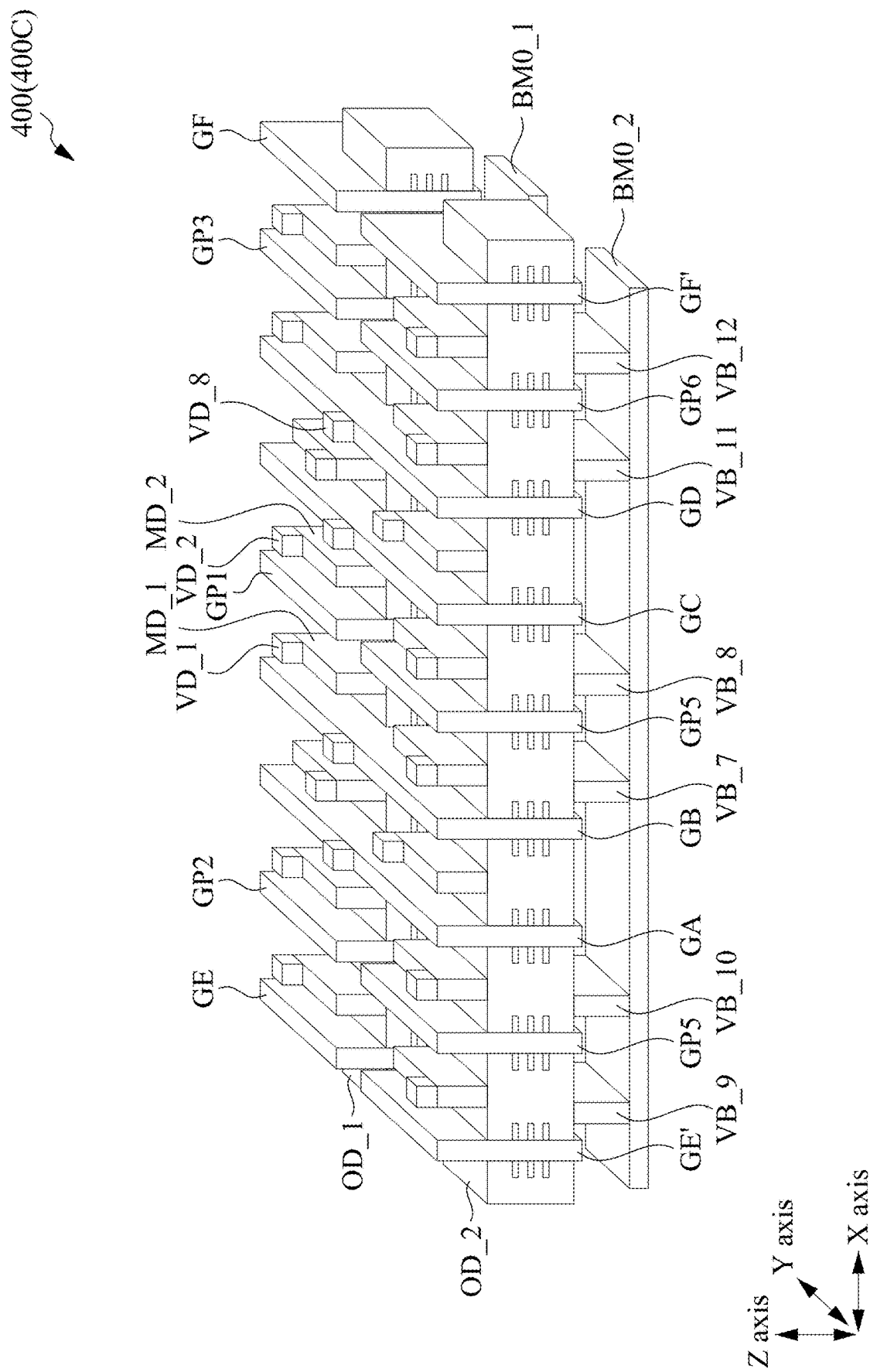

A schematic perspective view 400C in FIG. 4C further illustrates MD contact structures and VD/VG via structures over the active regions and gate regions. For simplicity, some, but not all, MD contact structures and VD/VG via structures are numbered in FIG. 4C.

Figure 4D:
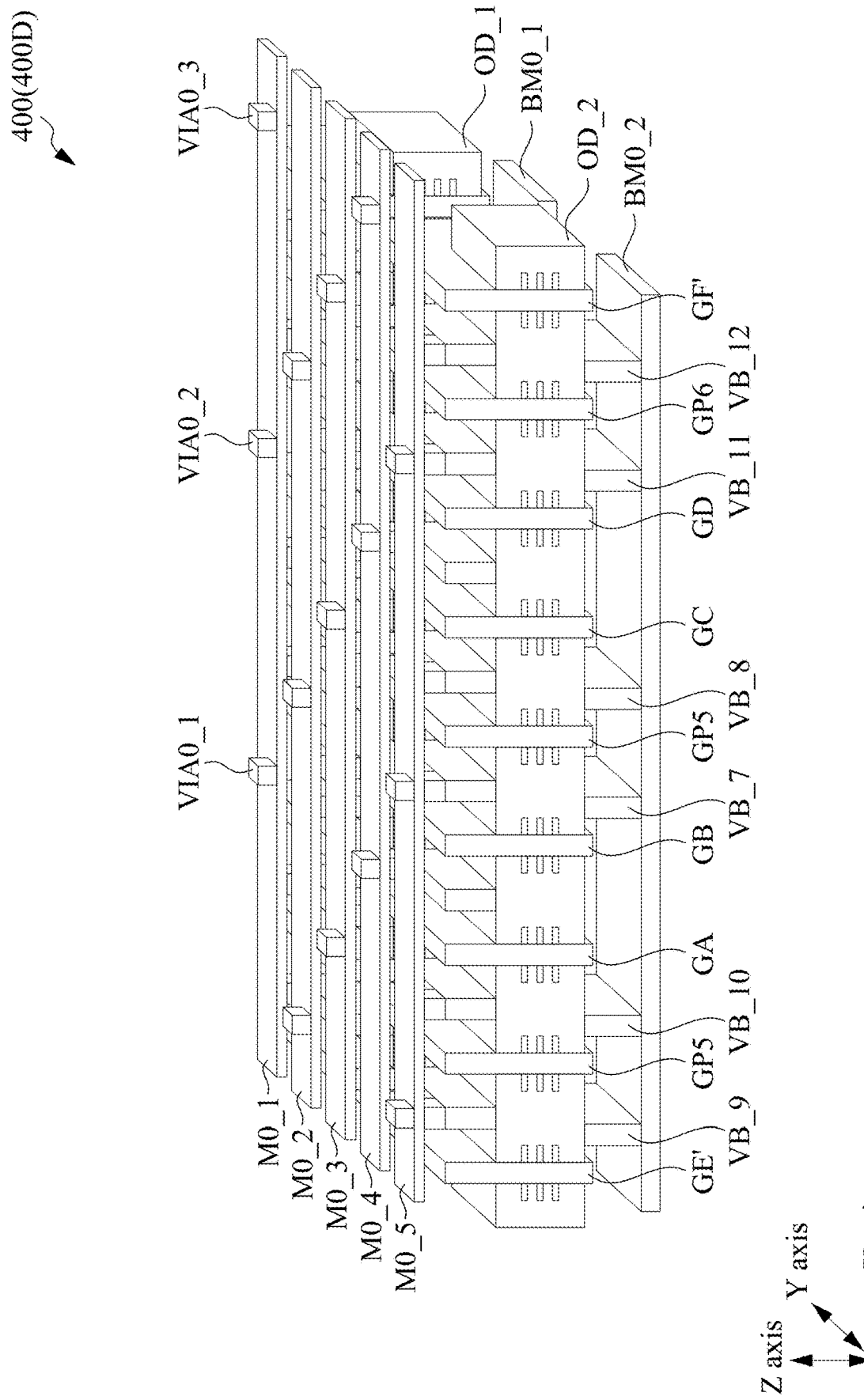

A schematic perspective view 400D in FIG. 4D further illustrates the M0 layer and a VIA0 layer over the VD/VG via structures. For simplicity, some, but not all, VIA0 via structures in the VIA0 layer are numbered in FIG. 4D. For example, via structures VIA0_1, VIA0_2, VIA0_3 are over the conductive pattern M0_1. The conductive patterns M0_1-M0_5 extend along the X axis and spaced from each other along the Y axis.

Figure 4E:
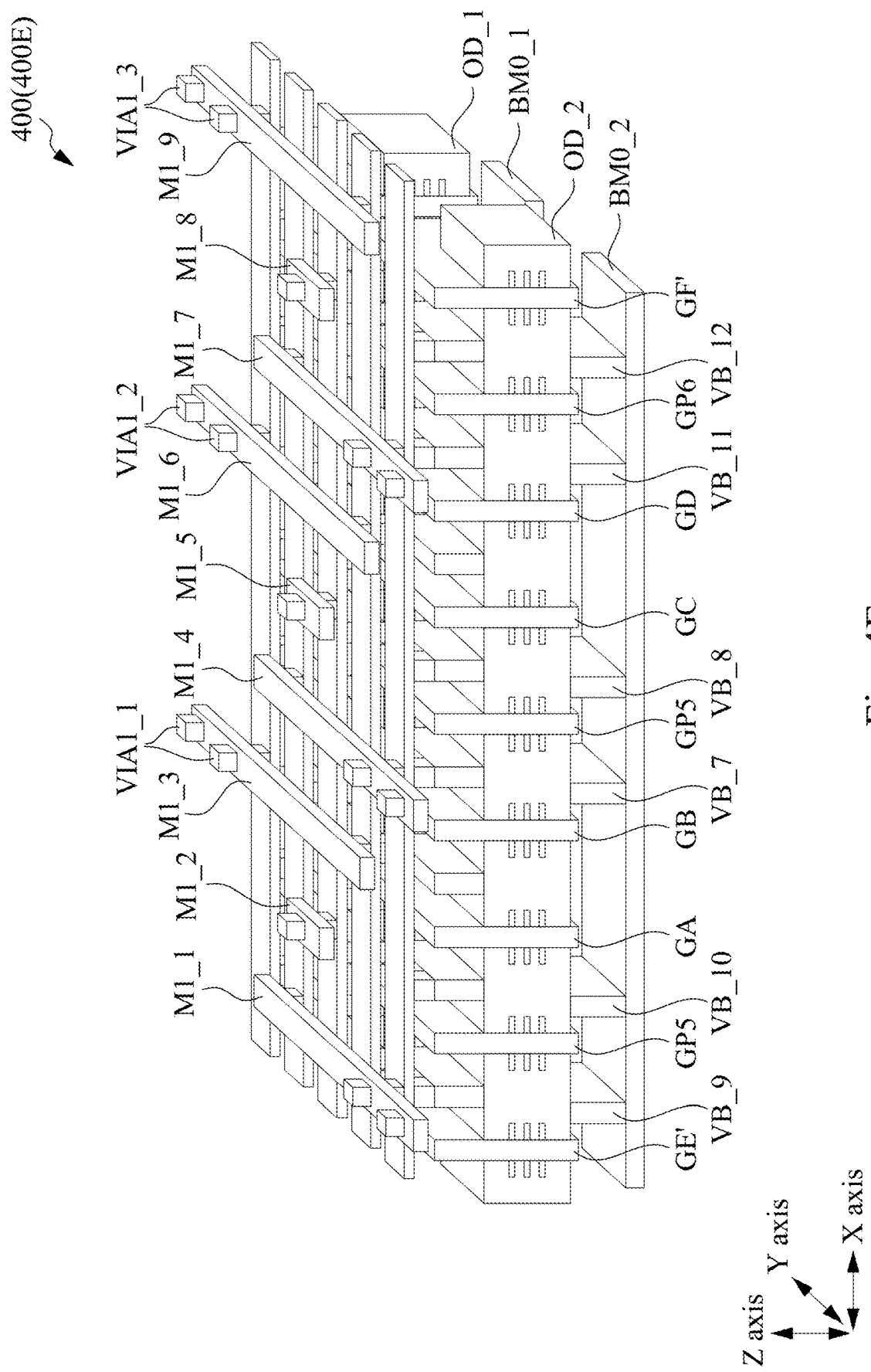

A schematic perspective view 400E in FIG. 4E further illustrates the metal-1 (M1) layer and a VIA1 layer over the VIA0 layer. The M1 layer comprises conductive patterns M1_1-M1_9 extending along the Y axis and spaced from each other along the X axis. For simplicity, some, but not all, VIA1 via structures in the VIA1 layer are numbered in FIG. 4E. For example, the conductive patterns M1_3, M1_6, M1_9 are over the corresponding via structures VIA0_1, VIA0_2, VIA0_3, and are electrically coupled to the conductive pattern M0_1 through the corresponding via structures VIA0_1, VIA0_2, VIA0_3. Via structures VIA1_1 are over the conductive pattern M1_3, via structures VIA1_2 are over the conductive pattern M1_6, and via structures VIA1_3 are over the conductive pattern M1_9.

Figure 4F:
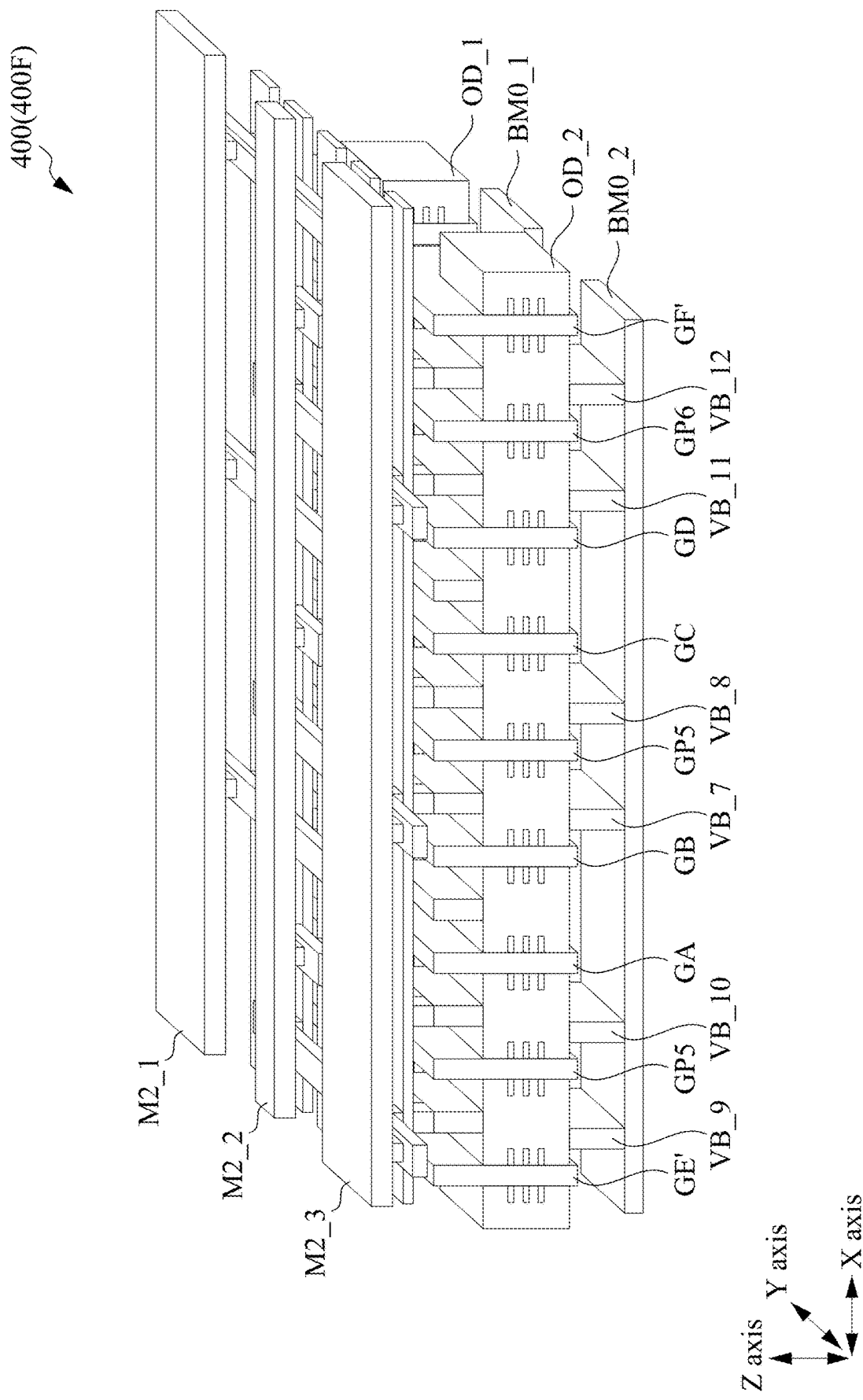

A schematic perspective view 400F in FIG. 4F further illustrates the metal-2 (M2) layer over the VIA1 layer. The M2 layer comprises conductive patterns M2_1, M2_2, M2_3 extending along the X axis and spaced from each other along the Y axis. For example, the conductive pattern M2_1 is over the corresponding via structures VIA1_1, VIA1_2, VIA1_3, and is electrically coupled to the conductive patterns M1_3, M1_6, M1_9 through the corresponding via structures VIA1_1, VIA1_2, VIA1_3. In at least one embodiment, one or more advantages described herein are achievable in the IC device 400.

Figure 5:
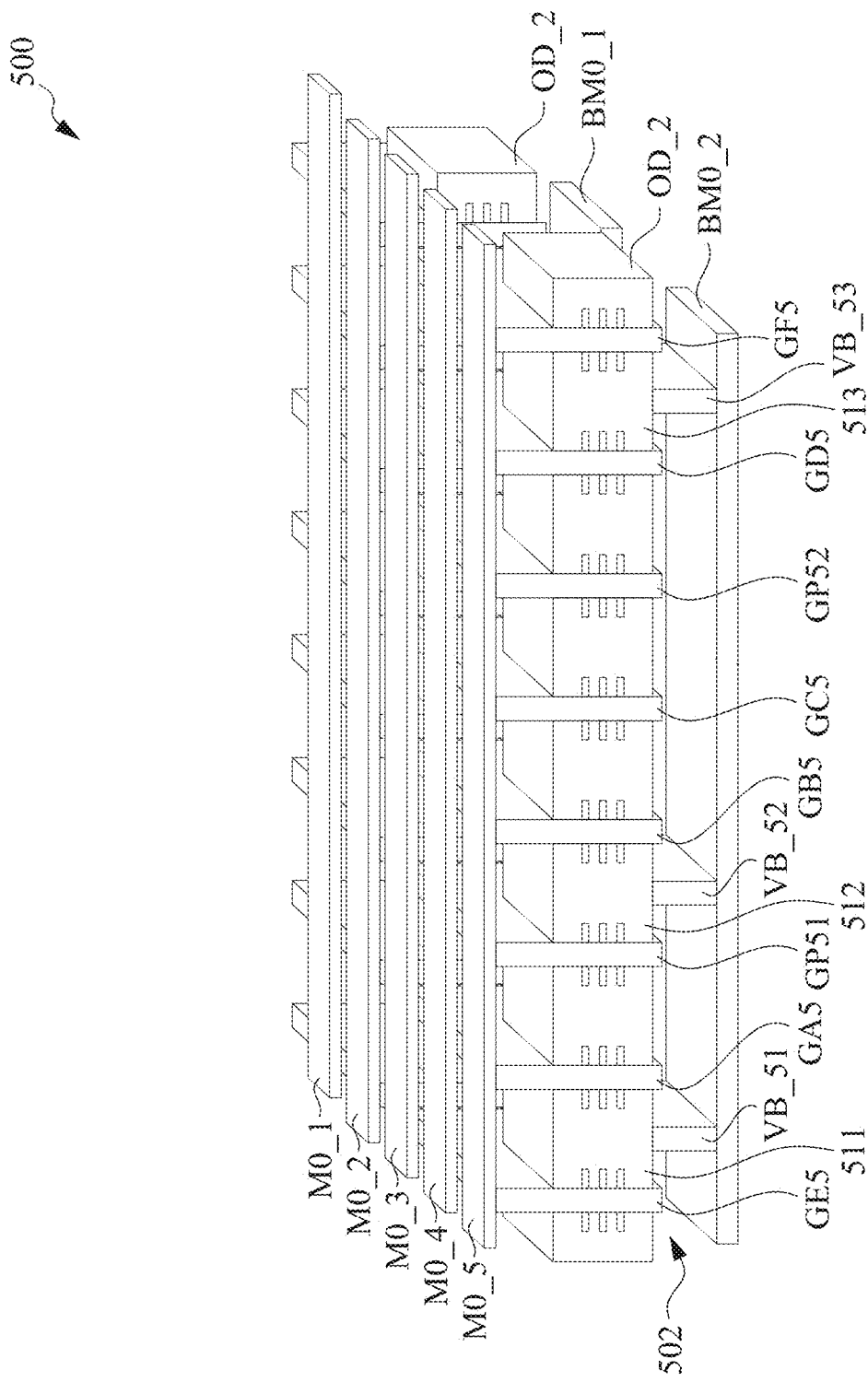
FIG. 5 is a schematic perspective view of an IC device, in accordance with some embodiments.

FIG. 5 is a schematic perspective view of an IC device 500, in accordance with some embodiments. The perspective view in FIG. 5 illustrates various layers from the BM0 layer to the M0 layer, in a manner similar to the perspective view in FIG. 4D. Corresponding elements in FIGS. 4D and 5 are indicated by the same reference numerals.

The IC device 500 comprises conductive patterns BM0_1, BM0_2, and through via structures VB_51, VB_52, VB_53 over the corresponding conductive pattern BM0_2. The IC device 500 comprises further through via structures (similar to through via structures VB_51, VB_52, VB_53) which are over the corresponding conductive pattern BM0_1 but are not visible in the perspective view in FIG. 5. For simplicity, a substrate through which the through via structures extend is not illustrated. Active regions OD_1, OD_2 are over the corresponding conductive pattern BM0_1, BM0_2. Gates GA5-GF5, and dummy gates GP51, GP52 extend across the corresponding active region OD_2. The IC device 500 comprises further gates of functional transistors (similar to gate GA5-GF5) and dummy gates (similar to dummy gates GP51, GP52) which extend across the corresponding active region OD_1, but are not visible in the perspective view in FIG. 5. The IC device 500 further comprises various MD contact structures and VD via structures over the corresponding active regions and gate regions. For simplicity, such MD contact structures are shown in FIG. 5, but are not labelled (labelling would be similar to that shown in FIG. 4). For simplicity, VD via structures are not illustrated in FIG. 5, but are similar to those shown in IC device 400. For example, the conductive patterns M0_1-M0_5 in the M0 layer are over the corresponding VD via structures.

In the example configuration in FIG. 5, two or more of a source/drain 511 between the gates GA5, GE5, a source/drain 512 between the gate GB5 and the dummy gate GP51, and a source/drain 513 between the gates GD5, GF5 are electrically coupled to each other both on the front side and on the back side. On the front side, two or more of the source/drains 511, 512, 513 are electrically coupled through the corresponding MD contact structures, VD via structures and the conductive pattern M0_5. On the back side, two or more of the source/drains 511, 512, 513 are electrically coupled through the corresponding through via structures VB_51, VB_52, VB_53 and the conductive pattern BM0_2.

In some embodiments, the active regions OD_1, OD_2, gates GA5-GF5, dummy gates GP51, GP52, MD contact structure, VD vias, and various metal layers and via layers are formed over a front side of a semiconductor substrate. Next, the semiconductor substrate is removed and replaced by a dielectric layer or substrate which is not shown for simplicity, but is schematically indicated by an arrow 502 in FIG. 5. The through via structures VB_51, VB_52, VB_53 are formed through the dielectric substrate, and the conductive pattern BM0_2 are formed on the back side of the dielectric substrate. Because the semiconductor substrate has been removed, there is no junction between the source/drains 511, 512, 513 and a semiconductor material when the source/drains 511, 512, 513 are electrically coupled to the conductive pattern BM0_2 by the corresponding through via structures VB_51, VB_52, VB_53. Further, in at least one embodiment, the dummy gate GP51 includes no conductive material or is filled with a dielectric material. Therefore, there is no parasitic capacitance between the dummy gate GP51 and the adjacent through via structure VB_52. In some embodiments, with the removal of a semiconductor substrate and/or removal of conductive materials from dummy gates, it is possible to reduce or at least keep parasitic capacitance at about the same level, while reducing parasitic resistance. As a result, it is possible to improve an operating speed of the IC device 500 in one or more embodiments.

The IC device 500 comprises an example configuration where the source/drains electrically coupled on both the front side and the back side are not necessarily immediately adjacent source/drains. For example, the source/drains 512, 513, which are electrically coupled to each other on both the front side and the back side, are not immediately adjacent to each other. The IC device 500 also comprises an example configuration where a dummy gate is not necessarily immediately adjacent to a source/drain which is electrically coupled to another source/drain on both the front side and the back side. For example, the dummy gate GP52 is not immediately adjacent to any of the source/drains 512, 513, which are electrically coupled to each other on both the front side and the back side. In at least one embodiment, one or more advantages described herein are achievable in the IC device 500.

Figure 6:
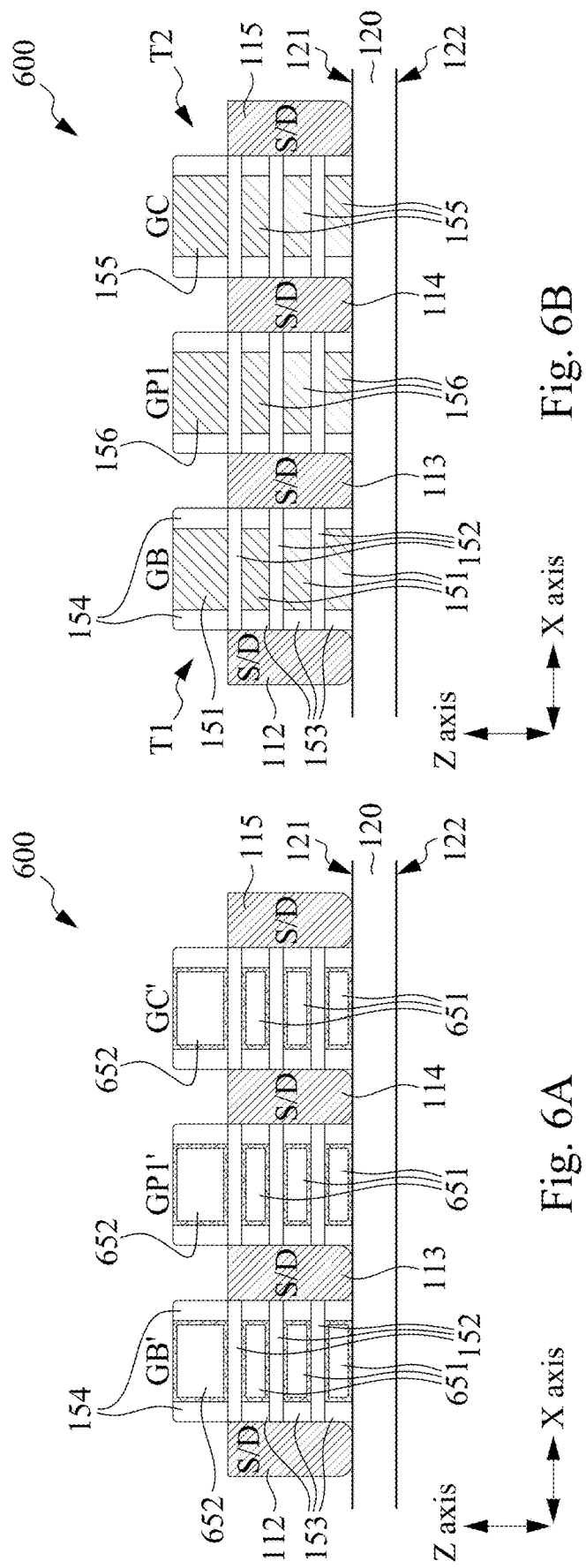
FIGS. 6A-6B are schematic cross-sectional views of an IC device being manufactured at various stages of a manufacturing process, in accordance with some embodiments.

FIGS. 6A-6B are schematic cross-sectional views of an IC device 600 being manufactured at various stages of a manufacturing process, in accordance with some embodiments. In at least one embodiment, the IC device 600 corresponds to the IC device 100B. Corresponding elements in FIGS. 1B and 6A, 6B are indicated by the same reference numerals.

In FIG. 6A, the manufacturing process starts with substrate 120. The substrate 120 comprises, in at least one embodiment, a silicon substrate. A plurality of stacks of alternating layers 651, 152 is grown on the first side 121 of the substrate 120. The stacks correspond to gates GB, GC, GP1 (shown in FIG. 6B) to be formed later, and are referred to herein as stacks GB', GC', GP1' (shown in FIG. 6A). In at least one embodiment, the layers 152 comprise Si and correspond to the channels of transistors to be form later, and the layers 651 comprise SiGe. Other materials are within the scopes of various embodiments. A dummy gate material 652 is deposited over a top of each of the stacks GB', GC', GP1'. In an example, the dummy gate material 652 is polysilicon. Other materials are within the scopes of various embodiments. Side portions of the layers 651 are etched and filled with a dielectric material to form inner spacers 153. Top spacers 154 are formed around the dummy gate material 652 at the top of each of the stacks GB', GC', GP1'. Source/drains 112, 113, 114, 115 are epitaxial grown over the first side 121 of the substrate 120 on opposite sides of each of the stacks GB', GC', GP1'. A resulting structure is obtained as shown in FIG. 6A.

In FIG. 6B, the layers 651 and the dummy gate material 652 in each of the stacks GB', GC', GP1' are removed, for example, by etching. Thereafter, a gate dielectric material and, subsequently, a conductive gate material, e.g., a metal, are filled in the stacks GB', GC' to form conductive gate stacks 151, 155. The stack GP1' is either left empty, or filled with a dielectric material, to form a gate stack 156 which contains no conductive material. The conductive gate stack 151, and the corresponding source/drains 112, 113 together configure a transistor T1. The conductive gate stack 155, and the corresponding source/drains 114, 115 together configure a transistor T2. A resulting structure is obtained as shown in FIG. 6B.

In subsequent processing, on the front side, corresponding MD contact structures are formed over the source/drains 112, 113, 114, 115 and the conductive gate stacks 151, 155, corresponding VD via structures are formed over the MD contact structures, and a corresponding conductive pattern M0_1 is formed over the VD via structures. In some embodiments, a front side metallization process is performed to form various front side metal layers connected by multiple front side via layers to define various connections within the IC device being manufactured and/or external connections with other equipment outside the IC device.

On the back side, as described with respect to FIG. 1B, through via structures VB_1, VB_2 are formed to extend from the second side 122, through the substrate 120, to the first side 121 in electrical contact with the corresponding source/drains 113, 114. In some embodiments, after the described metallization process on the front side, the substrate 120 is flipped upside down and bonded to a carrier via an adhesive to expose the back side of the substrate 120. A thickness portion on the back side of the substrate is removed, for example, by an etch or mechanical grinding process. VB via structures are formed to extend through the ground substrate at various locations to form, for example, power connections to power rails to be formed later. The through via structures VB_1, VB_2 electrically coupled to the source/drains 113, 114 are formed in this operation together with other VB via structures. Subsequently, a back side metallization process is performed. For example, a BM0 layer is formed over the second side 122 of the substrate 120 (which is in a state of being flipped upside down), and patterned to form various BM0 conductive patterns including the conductive pattern BM0_1 electrically coupled to the through via structures VB_1, VB_2. Other BM0 conductive patterns include power rails of one or more power supply voltages. A resulting structure is obtained as shown in FIG. 1B. In at least one embodiment, the back side metallization process comprises forming various back side metal layers connected by multiple back side via layers to define, for example, connections of the IC device to external circuitry or power sources. Upon completion of the back side metallization process, the carrier is removed from the substrate 120, with subsequent processing, e.g., singulation and/or packaging, to follow. In at least one embodiment, one or more advantages described herein are achievable in the IC device 600.

Figure 7:
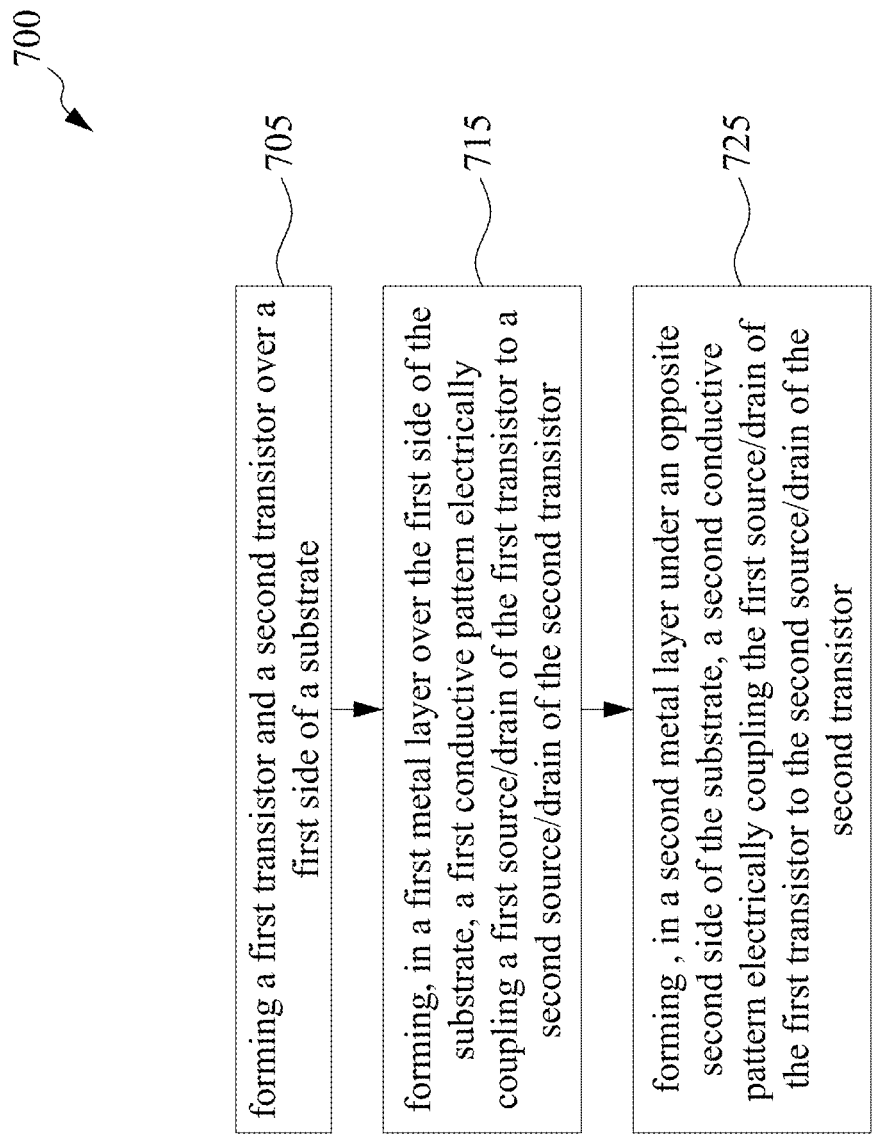
FIG. 7 is a flow chart of a method, in accordance with some embodiments.

FIG. 7 is a flow chart of a method 700 of manufacturing an IC device, in accordance with some embodiments. In at least one embodiment, the method 700 is for manufacturing an IC device described with respect to FIGS. 1A-1C, 2A-2C, 3, 4A-4F, 5, 6A-6B.

At operation 705, a first transistor and a second transistor are formed over a first side of a substrate which further has a second side opposite the first side. For example, a first transistor T1 and a second transistor T2 are formed over a first side 121 of a substrate 120 as described with respect to FIGS. 6A-6B. The substrate 120 further has a second side 122 opposite the first side 121.

At operation 715, in a first metal layer over the first side of the substrate, a first conductive pattern is formed to electrically couple a first source/drain of the first transistor to a second source/drain of the second transistor. For example, in some embodiments, in the M0 layer over the first side 121 of the substrate 120, a first conductive pattern M0_1 is formed to electrically couple a first source/drain 113 of the first transistor T1 to a second source/drain 114 of the second transistor T2, through corresponding contact structures MD_1, MD_2 and corresponding via structures VD_1, VD_2, as described with respect to FIG. 1B.

At operation 725, in a second metal layer under the second side of the substrate, a second conductive pattern is formed to electrically couple the first source/drain of the first transistor to the second source/drain of the second transistor. For example, in the BM0 layer under the second side 122 of the substrate 120, a second conductive pattern BM0_1 is formed to electrically couple the first source/drain 113 of the first transistor T1 to the second source/drain 114 of the second transistor T2, by way of corresponding through via structures VB_1, VB_2, as described with respect to FIG. 1B.

In at least one embodiment, the method 700 further comprises forming a dummy gate. For example, a dummy gate GP1 is formed to be free of conductive material and/or filled with a dielectric material, as described with respect to FIGS. 6A-6B. In at least one embodiment, one or more advantages described herein are achievable in an IC device manufactured by the method 700.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 8:
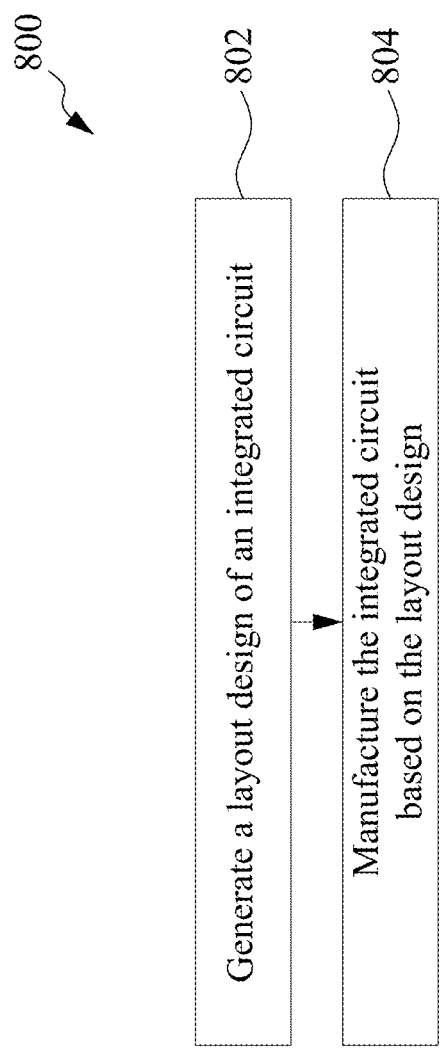
FIG. 8 is a flowchart of a method of forming or manufacturing an integrated circuit in accordance with some embodiments.

FIG. 8 is a flowchart of a method 800 of forming or manufacturing an integrated circuit in accordance with some embodiments. It is understood that additional operations may be performed before, during, and/or after the method 800 depicted in FIG. 8, and that some other operations may only be briefly described herein. In some embodiments, the method 800 is usable to form integrated circuits, such as IC device 100B-100C, 400, 500 or 600. In some embodiments, the method 800 is usable to form integrated circuits having similar structural relationships as one or more of layout design 100A or 300.

In operation 802 of method 800, a layout design of an integrated circuit is generated. Operation 802 is performed by a processing device (e.g., processor 1002) configured to execute instructions for generating a layout design. In some embodiments, the layout design of method 800 includes one or more patterns of at least IC layout design 100A or 300, or features similar to at least IC device 100B-100C, 400, 500, or 600. In some embodiments, the layout design of the present application is in a graphic database system (GDSII) file format.

In operation 804 of method 800, the integrated circuit is manufactured based on the layout design. In some embodiments, operation 804 of method 800 comprises manufacturing at least one mask based on the layout design, and manufacturing the integrated circuit based on the at least one mask. In some embodiments, method 700 is an embodiment of operation 804.

Figure 9:
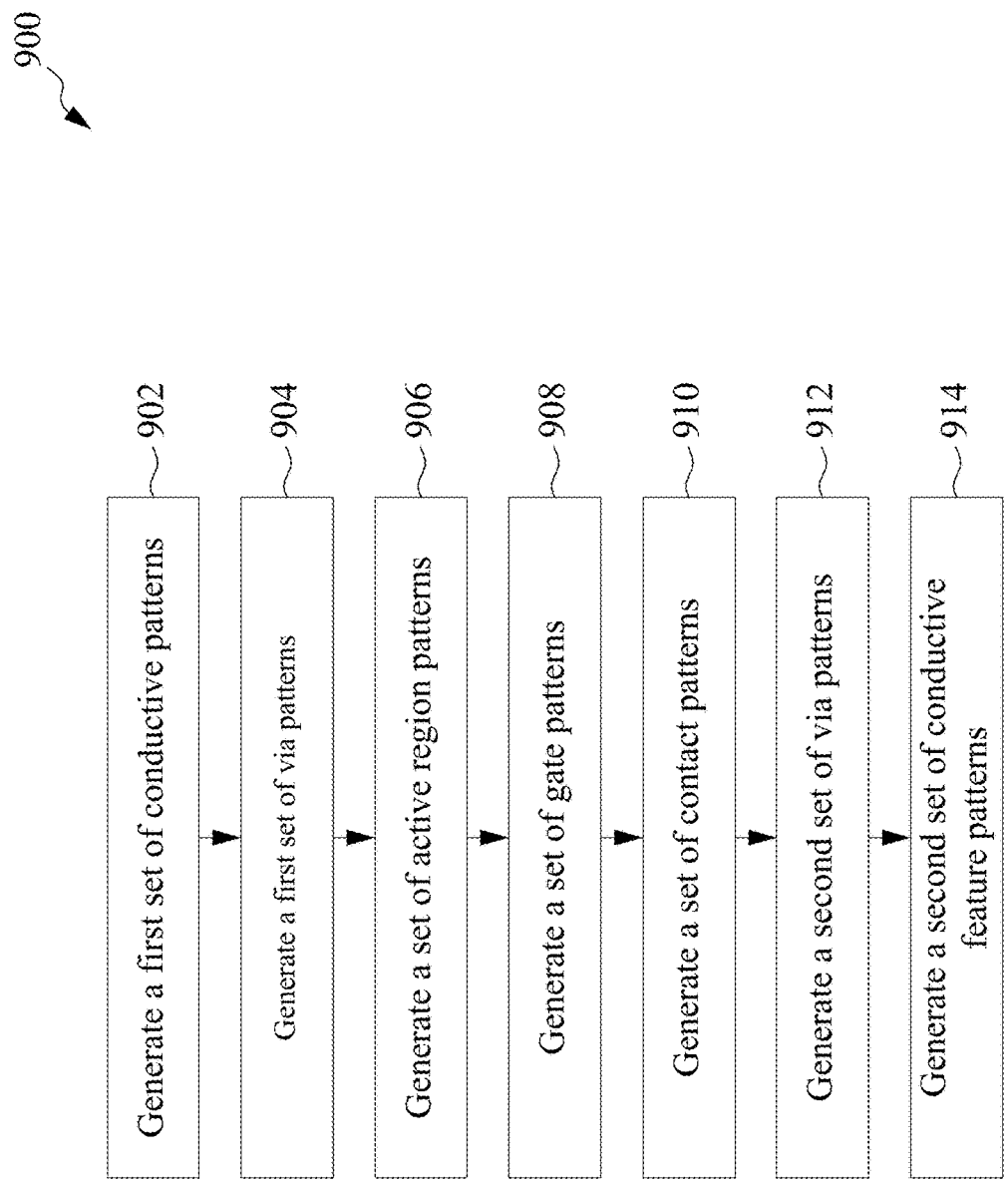
FIG. 9 is a flowchart of a method of generating a layout design of an integrated circuit in accordance with some embodiments.

FIG. 9 is a flowchart of a method 900 of generating a layout design of an integrated circuit in accordance with some embodiments. It is understood that additional operations may be performed before, during, and/or after the method 900 depicted in FIG. 9, and that some other processes may only be briefly described herein. In some embodiments, method 900 is an embodiment of operation 802 of method 800. In some embodiments, method 900 is usable to generate one or more layout patterns of at least IC layout design 100A or 300, or one or more patterns similar to at least IC device 100B-100C, 400, 500, or 600. In some embodiments, method 900 is usable to generate one or more layout patterns having structural relationships including alignment, lengths and widths, as well as configurations and layers of at least layout design 100A or 300, or one or more patterns similar to at least IC device 100B-100C, 400, 500, or 600, and similar detailed description will not be described in FIG. 9, for brevity.

In operation 902 of method 900, a first set of conductive patterns BM01, BM02 is generated or placed on the layout design.

In operation 904 of method 900, a first set of via patterns is generated or placed on the layout design. In some embodiments, the first set of via patterns of method 900 includes at least portions of one or more of through vias VB1-VB12.

In operation 906 of method 900, a set of active region patterns is generated or placed on a layout design. In some embodiments, the set of active region patterns of method 900 includes at least portions of one or more of the active regions OD1 and OD2.

In operation 908 of method 900, a set of gate patterns is generated or placed on the layout design. In some embodiments, the set of gate patterns of method 900 includes at least portions of one or more of gate regions A-F and P1-P6.

In operation 910 of method 900, a set of contact patterns is generated or placed on the layout design. In some embodiments, the set of contact patterns of method 900 includes at least portions of one or more of contact regions MD1-MD4.

In operation 912 of method 900, a second set of via patterns is generated or placed on the layout design. In some embodiments, the second set of via patterns of method 900 includes at least portions of one or more of vias VD1-VD8.

In operation 914 of method 900, a second set of conductive feature patterns is generated or placed on the layout design. In some embodiments, the second set of conductive feature patterns of method 900 includes at least portions of one or more of conductive patterns M01-M05.

Figure 10:
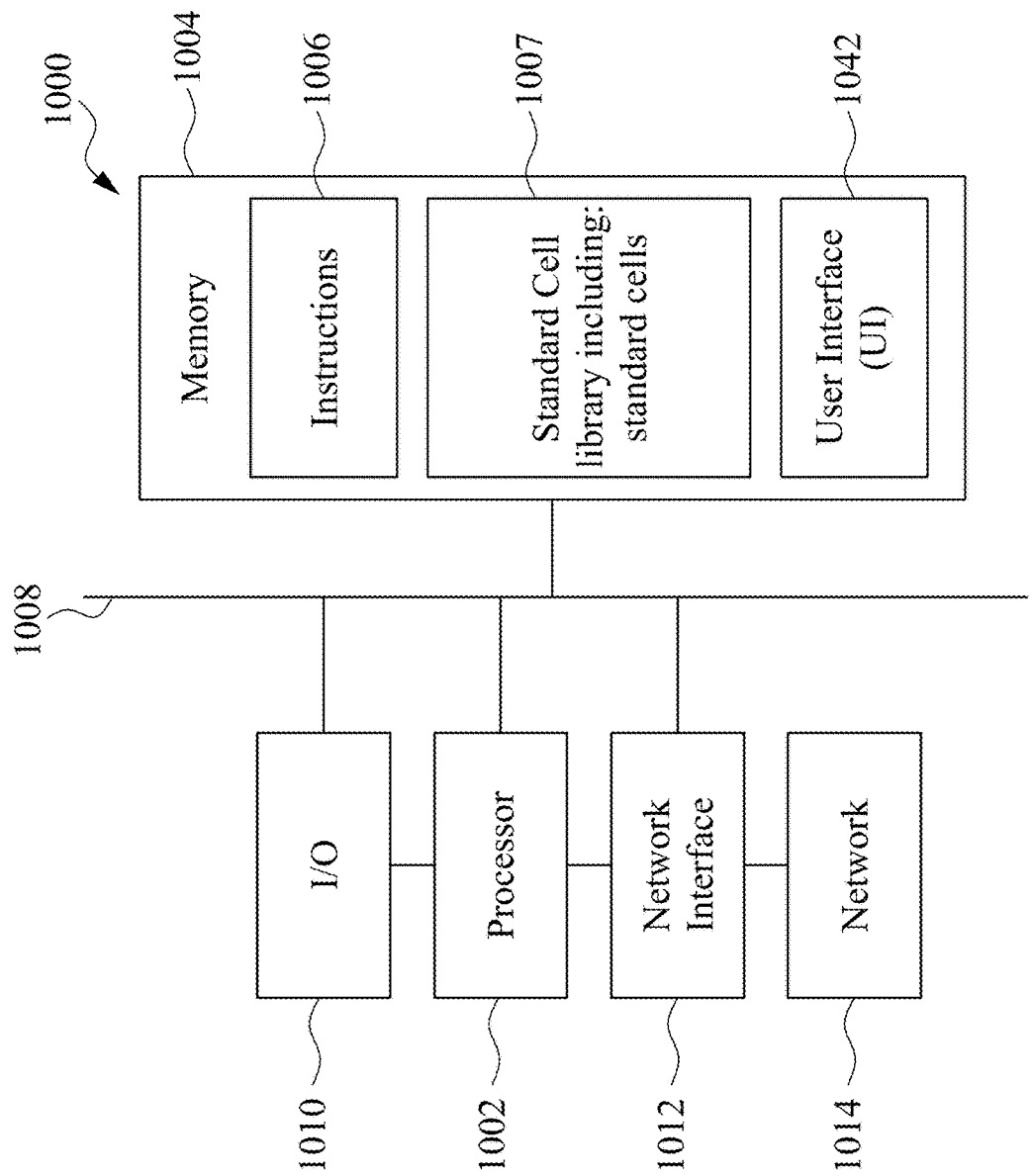
FIG. 10 is a block diagram of an EDA system, in accordance with some embodiments.

FIG. 10 is a block diagram of an electronic design automation (EDA) system 1000 for designing an IC layout design and manufacturing an IC circuit in accordance with some embodiments. In some embodiments, system 1000 generates or places one or more IC layout designs described herein. In some embodiments, system 1000 generates or places one or more IC layout designs described herein, and then manufactures an IC circuit based on the one or more IC layout designs.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
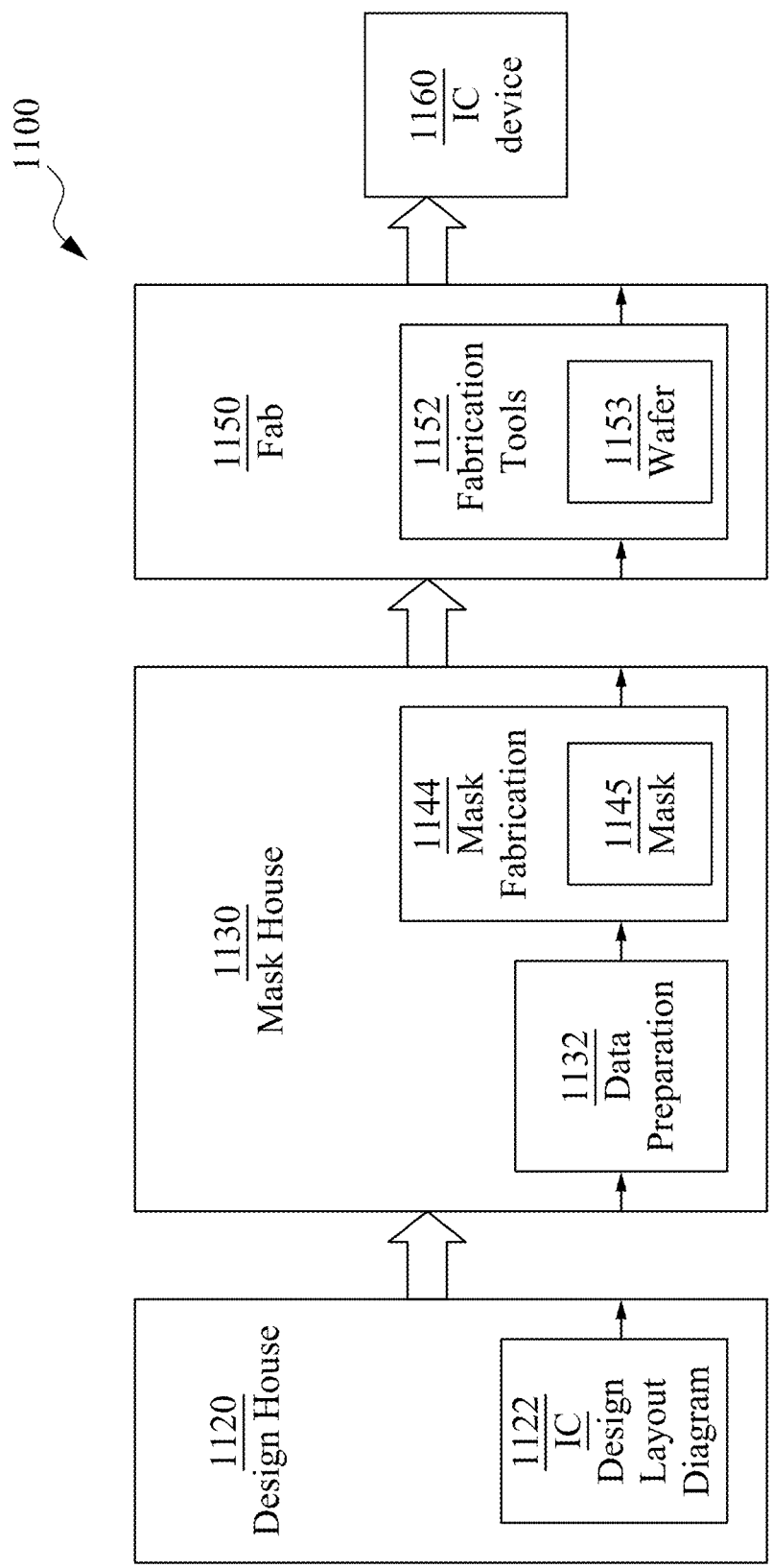
FIG. 11 is a block diagram of an IC manufacturing system and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place-and-route operation. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate having opposite first and second sides, an active region over the first side of the substrate, a first conductive pattern over the active region, and a second conductive pattern under the second side of the substrate. The active region comprises a first portion and a second portion. The first conductive pattern is electrically coupled to the first portion and the second portion of the active region. The second conductive pattern is electrically coupled to the first portion and the second portion of the active region.

In some embodiments, a system comprises a processor configured to generate an integrated circuit (IC) layout useable for manufacturing an IC device, an active region, a plurality of gate regions, first and second contact regions, first and second vias, first and second conductive patterns, and first and second through vias. The plurality of gate regions extends across the active region, and comprises a first gate region and a second gate region. The first contact region is over the active region, and immediately adjacent to the first gate region. The second contact region is over the active region, and immediately adjacent to the second gate region. The first via is over the first contact region. The second via is over the second contact region. The first conductive pattern is over the first via and the second via. The first through via is under the first contact region and the active region. The second through via is under the second contact region and the active region. The second conductive pattern is under the first through via and the second through via. The first conductive pattern, the first via, the first contact region, the first through via, and the second conductive pattern overlap one another. The first conductive pattern, the second via, the second contact region, the second through via, and the second conductive pattern overlap one another.

In some embodiments, a method comprises forming a first transistor and a second transistor over a first side of a substrate. The substrate has a second side opposite the first side. The method further comprises forming, in a first metal layer over the first side of the substrate, a first conductive pattern electrically coupling a first source/drain of the first transistor to a second source/drain of the second transistor. The method further comprises forming, in a second metal layer under the second side of the substrate, a second conductive pattern electrically coupling the first source/drain of the first transistor to the second source/drain of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a substrate having opposite first and second sides;
   an active region over the first side of the substrate, the active region comprising a first portion and a second portion;
   a first conductive pattern over the active region, and electrically coupling the first portion to the second portion of the active region; and
   a second conductive pattern under the second side of the substrate, and electrically coupling the first portion to the second portion of the active region.

2. The IC device of claim 1, further comprising:
   a first through via structure extending from the second side, through the substrate, to the first side in electrical contact with the first portion of the active region; and
   a second through via structure extending from the second side, through the substrate, to the first side in electrical contact with the second portion of the active region,
   wherein the second conductive pattern is electrically coupled to the first through via structure and the second through via structure.

3. The IC device of claim 2, further comprising:
a first contact structure over and in electrical contact with the first portion of the active region, the first contact structure electrically coupled to the first conductive pattern; and
a second contact structure over and in electrical contact with the second portion of the active region, the second contact structure electrically coupled to the first conductive pattern.

4. The IC device of claim 3, wherein at least one of
the first contact structure and the first through via structure are in direct contact with corresponding opposite surfaces of the first portion of the active region, or
the second contact structure and the second through via structure are in direct contact with corresponding opposite surfaces of the second portion of the active region.

5. The IC device of claim 3, wherein
along a thickness direction of the substrate from the first side to the second side,
the first conductive pattern, the first contact structure, the first portion of the active region, the first through via structure, and the second conductive pattern overlap one another, and
the first conductive pattern, the second contact structure, the second portion of the active region, the second through via structure, and the second conductive pattern overlap one another.

6. The IC device of claim 1, wherein
the first conductive pattern is in a metal-zero layer, and
the second conductive pattern is in a back side metal-zero layer.

7. The IC device of claim 1, further comprising:
a dummy gate between the first portion and the second portion of the active region.

8. The IC device of claim 7, wherein
the dummy gate includes a dielectric material.

9. The IC device of claim 1, further comprising:
a plurality of gates extending across the active region, and configuring together with the active region a plurality of transistors,
wherein
the plurality of transistors comprises
a first transistor having a source/drain being the first portion of the active region, and
a second transistor having a source/drain being the second portion of the active region, and
the first transistor and the second transistor configure a differential pair of transistors.

10. The IC device of claim 1, further comprising:
a plurality of gates extending across the active region, and configuring together with the active region a plurality of transistors,
wherein
the plurality of transistors comprises
a first transistor having a source/drain being the first portion of the active region, and
a second transistor having a source/drain being the second portion of the active region, and
the plurality of transistors are coupled into a daisy chain arrangement of a serializer/deserializer (SERDES) device.

11. A system, comprising:
a processor configured to generate an integrated circuit (IC) layout useable for manufacturing an IC device, the IC layout comprising:
an active region;
a plurality of gate regions extending across the active region, the plurality of gate regions comprising a first gate region and a second gate region;
a first contact region over the active region, and adjacent to the first gate region;
a second contact region over the active region, and adjacent to the second gate region;
a first via over the first contact region;
a second via over the second contact region;
a first conductive pattern over the first via and the second via;
a first through via under the first contact region and the active region;
a second through via under the second contact region and the active region; and
a second conductive pattern under the first through via and the second through via,
wherein
the first conductive pattern, the first via, the first contact region, the first through via, and the second conductive pattern overlap one another, and
the first conductive pattern, the second via, the second contact region, the second through via, and the second conductive pattern overlap one another.

12. The system of claim 11, wherein
the processor is configured to generate or place, on the IC layout,
the first conductive pattern in a metal-zero layer, and
the second conductive pattern in a back side metal-zero layer.

13. The system of claim 11, wherein
the processor is configured to generate or place, on the IC layout,
the second conductive pattern comprising a power supply voltage rail.

14. The system of claim 11, wherein
the processor is configured to generate or place, on the IC layout,
the first conductive pattern with a width smaller than a width of the second conductive pattern.

15. The system of claim 11, wherein
the processor is configured to generate or place, on the IC layout, at least one of
the first contact region with an area smaller than an area of the first through via, or
the second contact region with an area smaller than an area of the second through via.

16. The system of claim 11, wherein
the processor is configured to generate or place, on the IC layout,
the plurality of gate regions further comprising a dummy gate region arranged
between the first gate region and the second gate region, and
between the first contact region and the second contact region.

17. The system of claim 16, wherein
the processor is configured to generate or place, on the IC layout,
the dummy gate region immediately adjacent to the first gate region and the second gate region.

18. A method, comprising:
forming a first transistor and a second transistor over a first side of a substrate, the substrate having a second side opposite the first side;
forming, in a first metal layer over the first side of the substrate, a first conductive pattern electrically coupling a first source/drain of the first transistor to a second source/drain of the second transistor; and forming, in a second metal layer under the second side of the substrate, a second conductive pattern electrically coupling the first source/drain of the first transistor to the second source/drain of the second transistor.

19. The method of claim 18, further comprising:

removing a conductive material from a third gate arranged between a first gate of the first transistor and a second gate of the second transistor.

20. The method of claim 19, further comprising:

after said removing, filling a dielectric material into the third gate.

* * * * *